(12) United States Patent
Seong et al.

(10) Patent No.: US 12,490,621 B2
(45) Date of Patent: Dec. 2, 2025

(54) DISPLAY APPARATUS INCLUDING PARTITION WALL BETWEEN COLOR CONVERSION LAYERS

(71) Applicant: SAMSUNG DISPLAY CO., LTD., Yongin-si (KR)

(72) Inventors: Jaemin Seong, Yongin-si (KR); Sunkyu Joo, Yongin-si (KR); Keunchan Oh, Yongin-si (KR); Inok Kim, Yongin-si (KR); Yousik Shin, Yongin-si (KR); Byungchul Kim, Yongin-si (KR); Jaecheol Park, Yongin-si (KR); Gakseok Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 433 days.

(21) Appl. No.: 18/009,558

(22) PCT Filed: Sep. 11, 2020

(86) PCT No.: PCT/KR2020/012320
§ 371 (c)(1),
(2) Date: Dec. 9, 2022

(87) PCT Pub. No.: WO2021/251556
PCT Pub. Date: Dec. 16, 2021

(65) Prior Publication Data
US 2023/0209962 A1 Jun. 29, 2023

(30) Foreign Application Priority Data
Jun. 9, 2020 (KR) .................. 10-2020-0069926

(51) Int. Cl.
*H10K 59/38* (2023.01)
*H10K 59/80* (2023.01)

(52) U.S. Cl.
CPC .......... *H10K 59/38* (2023.02); *H10K 59/877* (2023.02); *H10K 59/8731* (2023.02); *H10K 59/8792* (2023.02)

(58) Field of Classification Search
CPC ... H10K 59/38; H10K 59/877; H10K 59/8792
See application file for complete search history.

(56) References Cited

U.S. PATENT DOCUMENTS 10,216,037 B2 2/2019 Kim et al.
10,439,167 B2 10/2019 Jo
(Continued)

FOREIGN PATENT DOCUMENTS

CN 110908168 A 3/2020
JP 1998268121 A 10/1998
(Continued)

OTHER PUBLICATIONS

International Search Report for PCT/KR2020/012320, Mailing Date: Mar. 8, 2021; 2 pages.

*Primary Examiner* — Nduka E Ojeh
(74) *Attorney, Agent, or Firm* — CANTOR COLBURN LLP

(57) ABSTRACT

A display apparatus including a first pixel, a second pixel, and a third pixel includes: a first color conversion layer disposed on a substrate to correspond to an emission area of the first pixel and including first quantum dots; a second color conversion layer corresponding to an emission area of the second pixel and including second quantum dots; and a partition wall disposed between the first color conversion layer and the second color conversion layer and including partition wall-scattering particles and a first pigment.

22 Claims, 17 Drawing Sheets

(56) References Cited

U.S. PATENT DOCUMENTS

| | | |
|---|---|---|
| 10,770,516 B2 | 9/2020 | Kim et al. |
| 2008/0197772 A1 | 8/2008 | Nam et al. |
| 2014/0168572 A1* | 6/2014 | Iwata ................ H05B 33/10 |
| | | 349/61 |
| 2017/0076678 A1* | 3/2017 | Lee .................. G02F 1/1336 |
| 2017/0133357 A1* | 5/2017 | Kuo .................. H10H 20/855 |
| 2018/0219183 A1 | 8/2018 | Song |
| 2019/0025634 A1* | 1/2019 | Park ............... G02F 1/133377 |
| 2019/0025655 A1* | 1/2019 | Kim ............... G02F 1/133512 |
| 2020/0089047 A1 | 3/2020 | Baek et al. |
| 2020/0111842 A1* | 4/2020 | Kim .................. H10K 59/173 |
| 2022/0102431 A1* | 3/2022 | Huang ................ H10K 59/38 |
| 2023/0006162 A1* | 1/2023 | Sakakibara ............ H10K 50/11 |

FOREIGN PATENT DOCUMENTS

| | | | |
|---|---|---|---|
| KR | 100787467 B1 | | 12/2007 |
| KR | 1020080018399 A | | 2/2008 |
| KR | 1020080045426 A | | 5/2008 |
| KR | 1020160002870 A | | 1/2016 |
| KR | 20160015815 A | | 2/2016 |
| KR | 20170063232 A | | 6/2017 |
| KR | 1020170108837 A | | 9/2017 |
| KR | 101903364 A | | 4/2018 |
| KR | 1020180066936 A | | 6/2018 |
| KR | 101925010 B1 | | 11/2018 |
| KR | 1020190052582 A | | 5/2019 |
| KR | 20190114822 A | * | 10/2019 |
| KR | 20200031750 A | | 3/2020 |
| KR | 20200038404 A | | 4/2020 |
| KR | 1020200039219 A | | 4/2020 |

\* cited by examiner

DISPLAY APPARATUS INCLUDING PARTITION WALL BETWEEN COLOR CONVERSION LAYERS

This application is a national stage application of International Patent Application No. PCT/KR2020/012320, filed on Sep. 11, 2020, claiming priority to Korean Patent Application No. 10-2020-0069926, filed on Jun. 9, 2020, and all the benefits accruing therefrom under 35 U.S.C. § 119, the content of which in its entirety is herein incorporated by reference.

TECHNICAL FIELD

Embodiments of the disclosure relate to a display apparatus.

BACKGROUND ART

Display apparatuses visually display data. Such display apparatuses include a substrate divided into a display area and a peripheral area. In the display area, scan lines and data lines are arranged to be insulated from each other, and a plurality of pixels is included. In addition, in the display area, a thin-film transistor and a pixel electrode electrically connected to the thin-film transistor are provided to be in correspondence with each of the pixels. Furthermore, the display area may also include an opposite electrode commonly provided in the pixels. The peripheral area may include various wires configured to transfer electrical signals to the display area, a scan driver, a data driver, a controller, a pad unit, etc.

Applications of such display apparatuses are being diversified. Accordingly, various design efforts are being made to improve the quality of display apparatuses.

SUMMARY

Embodiments include a display apparatus in which color emitted from each pixel is clearly realized and the light extraction efficiency is improved. However, the embodiments are only illustrative, and the scope of the disclosure is not limited thereto.

In an embodiment of the disclosure, a display apparatus including a first pixel, a second pixel, and a third pixel that emit different colors includes: a first color conversion layer disposed on a substrate and corresponding to an emission area of the first pixel and including first quantum dots; a second color conversion layer corresponding to an emission area of the second pixel and including second quantum dots; and a partition wall disposed between the first color conversion layer and the second color conversion layer and including partition wall-scattering particles and a first pigment.

In an embodiment of the disclosure, a display apparatus including a first pixel, a second pixel, and a third pixel includes: a first color conversion layer disposed on a substrate and corresponding to an emission area of the first pixel and including first quantum dots; a second color conversion layer corresponding to an emission area of the second pixel and including second quantum dots; and a partition wall disposed between the first color conversion layer and the second color conversion layer and including partition wall-scattering particles and a first pigment.

In an embodiment, the partition wall may include a stack of: a first partition wall layer including the partition wall-scattering particles; and a second partition wall layer including the first pigment.

In an embodiment, a thickness of the second partition wall layer may be less than a thickness of the first partition wall layer.

In an embodiment, each of the first pixel, the second pixel, and the third pixel may include a light source emitting blue light, and the second partition wall layer may be located closer to the light source than the first partition wall layer is.

In an embodiment, the first pigment may be yellow.

In an embodiment, an amount of the partition wall-scattering particles included in the partition wall may be 5 weight percent (wt %) to 20 wt %.

In an embodiment, the first pixel may have a color of a longer wavelength than that of the second pixel, and an average size of the first quantum dots may be greater than an average size of the second quantum dots.

In an embodiment, a width of the first partition wall layer may be less than or equal to a width of the second partition wall layer.

In an embodiment, the display apparatus may further include a lower scattering particle layer disposed under the first color conversion layer and the second color conversion layer and including lower-scattering particles.

In an embodiment, the display apparatus may further include an upper scattering particle layer located over the first color conversion layer and the second color conversion layer and including upper-scattering particles.

In an embodiment the partition wall may be provided as a single layer, an amount of the partition wall-scattering particles included in the partition wall may be 5 wt % to 20 wt %, and an amount of the first pigment included in the partition wall may be 0.4 wt % to 2 wt %.

In an embodiment, the first color conversion layer may include first scattering particles, and the second color conversion layer may include second scattering particles.

In an embodiment, the first pixel may have a color of a longer wavelength than that of the second pixel, and an average size of the first scattering particles may be greater than an average size of the second scattering particles.

In an embodiment, the display apparatus may further include a transmissive window located to correspond to the third pixel, and the transmissive window may include third scattering particles.

In an embodiment, the display apparatus may further include a first color filter located to correspond to the first pixel, a second color filter located to correspond to the second pixel, and a third color filter located to correspond to the third pixel, where the first to third color filters may have different colors from each other.

In an embodiment of the disclosure, a display apparatus includes: a first pixel, a second pixel, and a third pixel, each including an organic light-emitting diode located on a substrate and emitting blue light; a thin-film encapsulation layer covering the organic light-emitting diode; an upper substrate located on the thin-film encapsulation layer and including a first color conversion layer corresponding to the first pixel, a second color conversion layer corresponding to the second pixel, and a transmissive window corresponding to the third pixel; and a partition wall located on a lower surface of the upper substrate to correspond to a non-emission area between the first pixel, the second pixel, and the third pixel, where the partition wall includes partition wall-scattering particles and a first pigment.

In an embodiment, an amount of the partition wall-scattering particles included in the partition wall may be 5 wt % to 20 wt %.

In an embodiment, a diameter of the partition wall-scattering particles may be about 200 nanometer (nm) to about 450 nm.

In an embodiment, the partition wall may include a stack of: a first partition wall layer including the partition wall-scattering particles; and a second partition wall layer including the first pigment, and light transmittance of the first partition wall layer may be greater than light transmittance of the second partition wall layer.

In an embodiment, the first pigment may be yellow.

In an embodiment, the display apparatus may further include a first color filter located to correspond to the first pixel, a second color filter located to correspond to the second pixel, and a third color filter located to correspond to the third pixel, where the first to third color filters may have different colors from each other.

In an embodiment, the display apparatus may further include a light-blocking pattern located between the first color filter and the second color filter, where the light-blocking pattern may have a color identical to that of the third color filter.

A display apparatus in embodiments of the disclosure includes a partition wall including partition wall-scattering particles and a pigment, thereby enabling improvement of visibility and light efficiency.

DETAILED DESCRIPTION

Figure 1A:
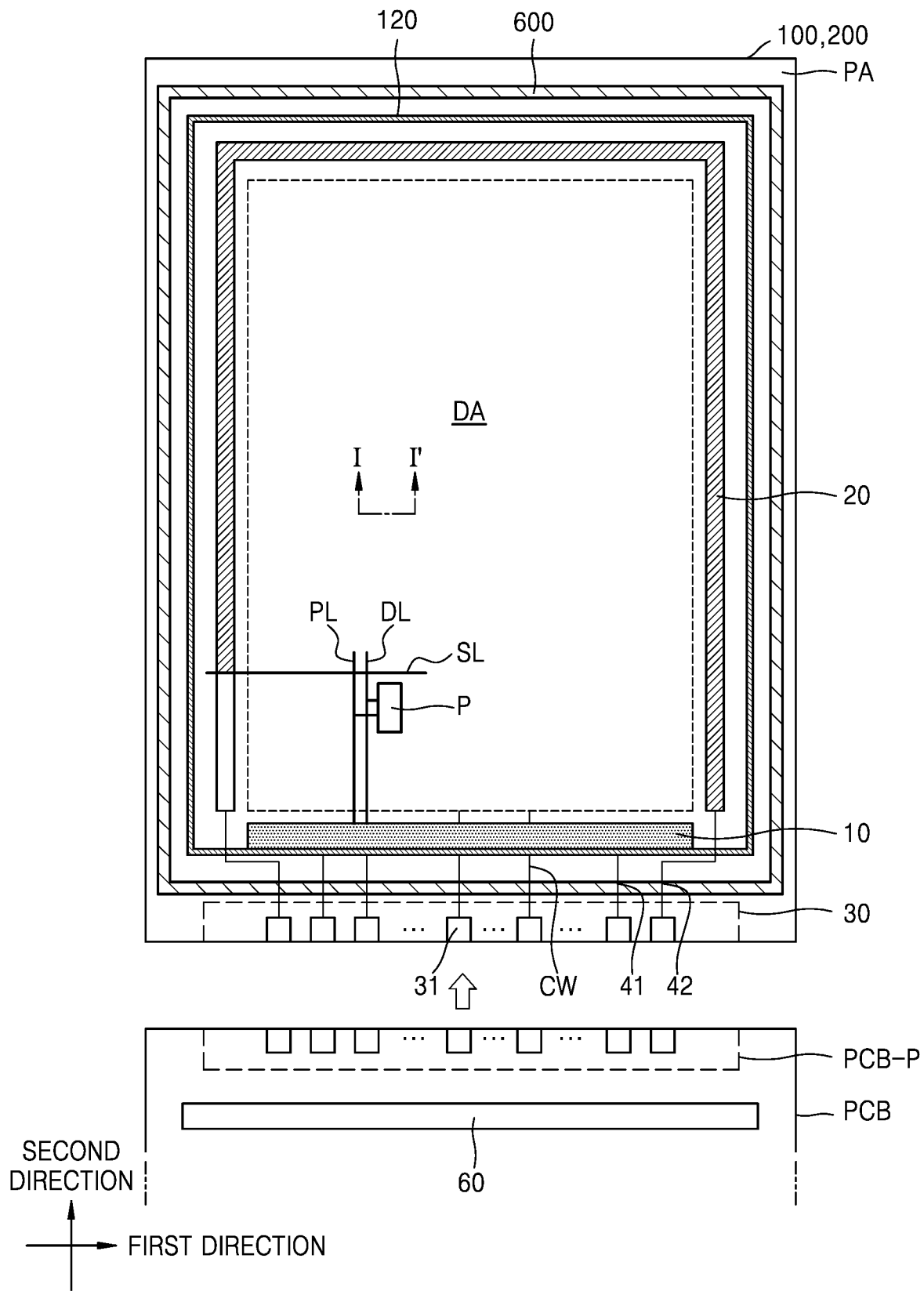
FIGS. 1A and 1B are schematic plan views of embodiments of a display apparatus according to the disclosure.

Various modifications may be applied to the illustrative embodiments, and particular embodiments of the disclosure will be illustrated in the drawings and described in the detailed description section. The effect and features of the illustrative embodiments, and a method to achieve the same, will be clearer referring to the detailed descriptions below with the drawings. However, the disclosure may be implemented in various forms, not by being limited to the embodiments presented below.

Hereinafter, embodiments of the disclosure will be described in detail with reference to the accompanying drawings, and in the description with reference to the drawings, the same or corresponding components are indicated by the same reference numerals and redundant descriptions thereof are omitted.

In the following embodiment, it will be understood that although the terms "first," "second," etc. may be used herein to describe various components, these components should not be limited by these terms. These terms are only used to distinguish one component from another.

In the following embodiment, the expression of singularity in the specification includes the expression of plurality unless clearly specified otherwise in context.

In the following embodiment, it will be further understood that the terms "comprises" and/or "comprising" used herein specify the presence of stated features or components, but do not preclude the presence or addition of one or more other features or components.

In the following embodiment, it will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated or reduced for convenience of explanation. In other words, since sizes and thicknesses of components in the drawings are arbitrarily illustrated for convenience of explanation, the following embodiments are not limited thereto.

In the following embodiment, it will be understood that when a layer, region, or component is connected to another layer, region, or component, the layers, regions or components may not only be directly connected, but may also be indirectly connected via another layer, region, or component therebetween. For example, in the specification, when a layer, region, or component is electrically connected to another layer, region, or component, the layers, regions, or components may not only be directly electrically connected, but may also be indirectly electrically connected via another layer, region, or component therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

A display apparatus is an apparatus that displays an image, and may be an organic light-emitting display apparatus, an inorganic electroluminescent ("EL") display apparatus (for example, an inorganic light-emitting display apparatus), a quantum dot light-emitting display apparatus, or the like.

Hereinafter, an organic light-emitting display apparatus is described as a display apparatus in an embodiment of the disclosure, but the display apparatus of the disclosure is not limited thereto, and may be any type of display apparatus.

Figure 1B:
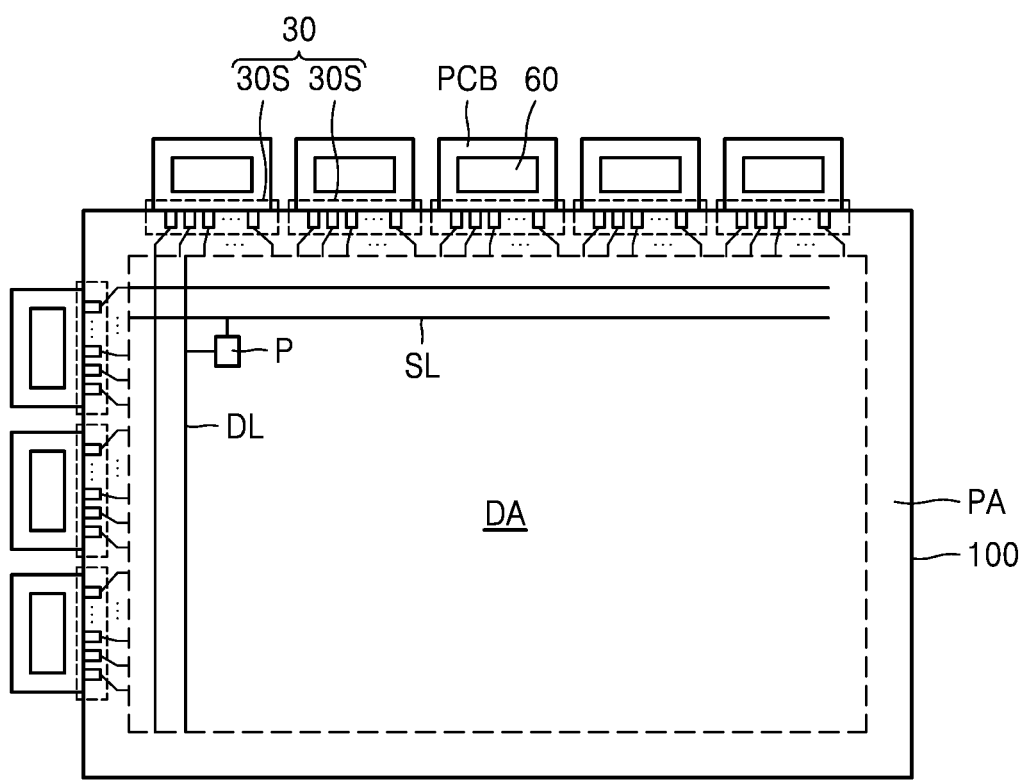

FIGS. 1A and 1B are schematic plan views of embodiments of a display apparatus in embodiments of the disclosure.

Referring to FIG. 1A, the display apparatus may be formed by bonding a substrate 100 and an upper substrate 200 together by a sealing member 600. The sealing member 600 may surround respective outer surfaces of the substrate 100 and the upper substrate 200 to bond the substrate 100 and the upper substrate 200 together.

The display apparatus may include a display area DA and a peripheral area PA around the display area DA. The display apparatus may provide a certain image by using light emitted from a plurality of pixels located in the display area DA.

The display area DA includes pixels P connected to a scan line SL extending in a first direction and a data line DL extending in a second direction intersecting the first direction. Each of the pixels P is also connected to a driving voltage line PL extending in the second direction.

Each pixel P may include a display element, such as an organic light-emitting diode OLED (refer to FIGS. 2A and 2B) or an inorganic light-emitting diode ("ILED"). Each pixel P may emit red light, green light, blue light, or white light, for example, via the display element. The pixel P in the specification may be understood as a subpixel emitting one of red light, green light, blue light, and white light as described above. In some embodiments, the display elements included in the pixels P may emit the same color, and a color of each pixel P may be realized by a color filter located over the display element.

Each pixel P may be electrically connected to embedded circuits located in the peripheral area PA. A first power supply line 10, a second power supply line 20, and a pad unit 30 may be located in the peripheral area PA.

The first power supply line 10 may be located to correspond to one side of the display area DA. The first power supply line 10 may be connected to a plurality of driving voltage lines PL which transmit a driving voltage ELVDD (refer to FIGS. 2A and 2B) to the pixel P.

The second power supply line 20 may partially surround the display area DA by having a loop shape of which one side is open. The second power supply line 20 may provide a common voltage to an opposite electrode of the pixel P. The second power supply line 20 may be referred to as a common voltage supply line.

The pad unit 30 includes a plurality of pads 31 and may be located on one side of the substrate 100. Each of the pads 31 may be connected to a first connection line 41 connected to the first power supply line 10, connection lines CW extending to the display area DA, or the like. The pads 31 of the pad unit 30 may be exposed by not being covered by an insulating layer, and may be electrically connected to a printed circuit board PCB. A printed circuit board terminal unit PCB-P of the printed circuit board PCB may be electrically connected to the pad unit 30.

The printed circuit board PCB transmits a signal or power of a controller (not shown) to the pad unit 30. The controller may provide the driving voltage ELVDD and a common voltage ELVSS (refer to FIGS. 2A and 2B) to the first and second power supply lines 10 and 20 via first and second connection lines 41 and 42, respectively.

A data driving circuit 60 is electrically connected to the data line DL. A data signal of the data driving circuit 60 may be provided to each of the pixels P via the connection line CW connected to the pad unit 30 and the data line DL connected to the connection line CW. FIG. 1 illustrates that the data driving circuit 60 is located on the printed circuit board PCB. However, in another embodiment, the data driving circuit 60 may be located on the substrate 100. In an embodiment, the data driving circuit 60 may be located between the pad unit 30 and the first power supply line 10, for example.

A dam unit 120 may be located in the peripheral area PA. During formation of an organic encapsulation layer 420 of a thin-film encapsulation layer 400 (refer to FIG. 3A), the dam unit 120 may block an organic material from flowing toward an edge of the substrate 100, thereby preventing formation of an edge tail of the organic encapsulation layer 420. The dam unit 120 may be located on the peripheral area PA to surround at least a portion of the display area DA. The dam unit 120 may include a plurality of dams, and when the plurality of dams is arranged, each of the dams may be spaced apart from each other. The dam unit 120 may be located closer to the display area DA than the sealing member 600 is, in the peripheral area PA. The peripheral area PA may further include an embedded driving circuit unit (not shown) that provides a scan signal of each pixel. In some embodiments, the embedded driving circuit unit and the dam unit 120 may overlap each other.

FIG. 1A illustrates that one printed circuit board PCB is attached to the pad unit 30. However, as in FIG. 1B, a plurality of printed circuit boards PCB may be attached to the pad unit 30.

Also, the pad unit 30 may be located along two sides of the substrate 100. The pad unit 30 may include a plurality of sub-pad units 30s, and one printed circuit board PCB may be attached to each of the sub-pad units 30s.

Figure 2A:
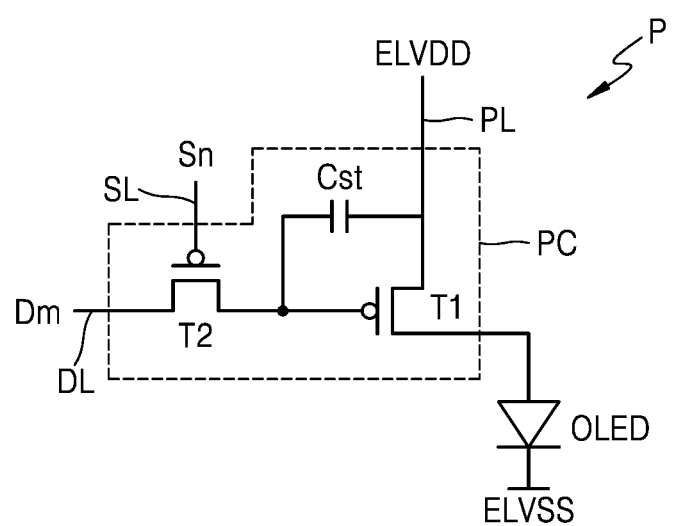
FIGS. 2A and 2B are equivalent circuit diagrams of an embodiment of any one pixel of a display apparatus according to the disclosure.
Figure 2B:
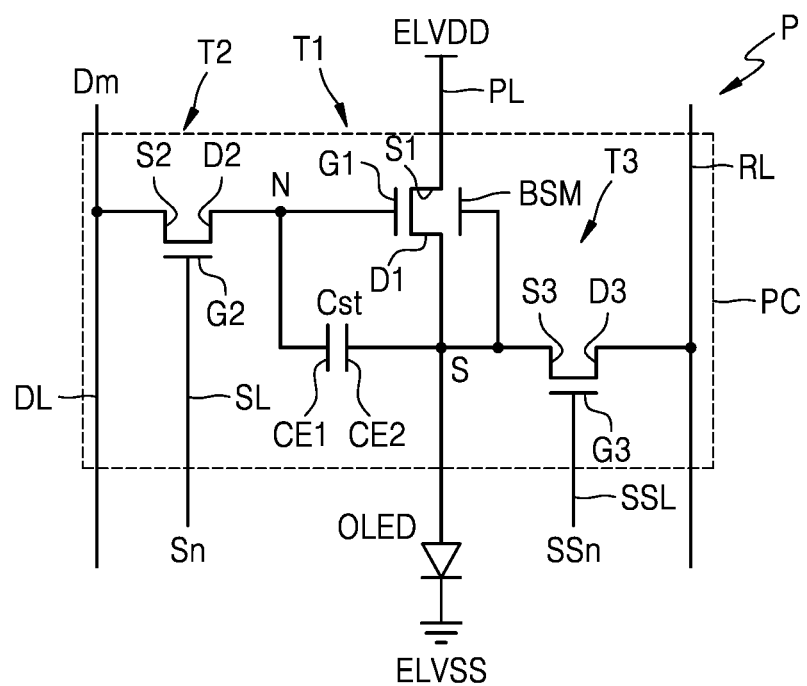

FIGS. 2A and 2B are equivalent circuit diagrams of an embodiment of any one pixel of a display apparatus according to the disclosure.

Referring to FIG. 2A, each pixel P includes a pixel circuit PC connected to the scan line SL and the data line DL, and an organic light-emitting diode OLED connected to the pixel circuit PC.

The pixel circuit PC includes a driving thin-film transistor T1, a switching thin-film transistor T2, and a storage capacitor Cst. The switching thin-film transistor T2 is connected to the scan line SL and the data line DL, and transmits a data signal Dm input via the data line DL to the driving thin-film transistor T1 according to the scan signal Sn input via the scan line SL.

The storage capacitor Cst is connected to the switching thin-film transistor T2 and the driving voltage line PL, and stores a voltage corresponding to a difference between a voltage received from the switching thin-film transistor T2 and the driving voltage ELVDD (also referred to as a first power voltage) supplied to the driving voltage line PL.

The driving thin-film transistor T1 is connected to the driving voltage line PL and the storage capacitor Cst, and may control a driving current flowing from the driving voltage line PL to the organic light-emitting diode OLED, according to a voltage value stored in the storage capacitor Cst. The organic light-emitting diode OLED may emit light having a certain luminance by the driving current.

In FIG. 2A, a case where the pixel circuit PC includes two thin-film transistors and one storage capacitor is illustrated, but the disclosure is not limited thereto.

Referring to FIG. 2B, each pixel P may include the organic light-emitting diode OLED and the pixel circuit PC including a plurality of thin-film transistors which drive the organic light-emitting diode OLED. The pixel circuit PC may include the driving thin-film transistor T1, the switching thin-film transistor T2, a sensing thin-film transistor T3, and the storage capacitor Cst.

The scan line SL may be connected to a gate electrode G2 of the switching thin-film transistor T2, the data line DL may be connected to a source electrode S2, and a first electrode CE1 of the storage capacitor Cst may be connected to a drain electrode D2.

Accordingly, the switching thin-film transistor T2 supplies a data voltage of the data line DL to a first node N in response to the scan signal Sn from the scan line SL of each pixel P.

A gate electrode G1 of the driving thin-film transistor T1 may be connected to the first node N, a source electrode S1 may be connected to the driving voltage line PL which transmits the driving voltage ELVDD, and a drain electrode D1 may be connected to an anode electrode of the organic light-emitting diode OLED.

Accordingly, the driving thin-film transistor T1 may adjust an amount of current flowing in the organic light-emitting diode OLED, according to its source-gate voltage, that is, a voltage applied between the driving voltage ELVDD and the first node N.

A sensing control line SSL may be connected to a gate electrode G3 of the sensing thin-film transistor T3, a source electrode S3 may be connected to a second node S, and a drain electrode D3 may be connected to a reference voltage line RL. In some embodiments, the sensing thin-film transistor T3 may be controlled not by the sensing control line SSL but by the scan line SL.

The sensing thin-film transistor T3 may sense a potential of a pixel electrode (for example, the anode electrode) of the organic light-emitting diode OLED. The sensing thin-film transistor T3 supplies a pre-charging voltage from the reference voltage line RL to the second node S in response to a sensing signal SSn from the sensing control line SSL, or supplies a voltage of the pixel electrode (for example, the anode electrode) of the organic light-emitting diode OLED to the reference voltage line RL during a sensing period.

The first electrode CE1 of the storage capacitor Cst is connected to the first node N, and a second electrode CE2 thereof is connected to the second node S. The storage capacitor Cst charges a difference voltage between voltages respectively suppled to the first and second nodes N and S, and supplies the charged difference voltage as a driving voltage of the driving thin-film transistor T1. In an embodiment, the storage capacitor Cst may charge a difference voltage between a data voltage Dm and a pre-charging voltage respectively supplied to the first and second nodes N and S, for example.

A bias electrode BSM may be provided to correspond to the driving thin-film transistor T1 and may be connected to the source electrode S3 of the sensing thin-film transistor T3. Because the bias electrode BSM receives a voltage in association with a potential of the source electrode S3 of the sensing thin-film transistor T3, the driving thin-film transistor T1 may be stabilized. In some embodiments, the bias electrode BSM may be connected to a separate bias line without being connected to the source electrode S3 of the sensing thin-film transistor T3.

An opposite electrode (for example, a cathode electrode) of the organic light-emitting diode OLED receives the common voltage ELVSS. The organic light-emitting diode OLED emits light by receiving a driving current from the driving thin-film transistor T1.

Although FIG. 2B illustrates that each pixel P includes signal lines SL, SSL, and DL, the reference voltage line RL, and the driving voltage line PL, the disclosure is not limited thereto. In an embodiment, at least one of the signal lines SL, SSL, and DL, or/and the reference voltage line RL, and the driving voltage line PL may be shared by neighboring pixels, for example.

The pixel circuit PC is not limited to the number of thin-film transistors, the number of storage capacitors, and circuit designs described above with reference to FIGS. 2A and 2B, and the number of thin-film transistors, the number of storage capacitors, and a circuit design may vary.

Figure 3A:
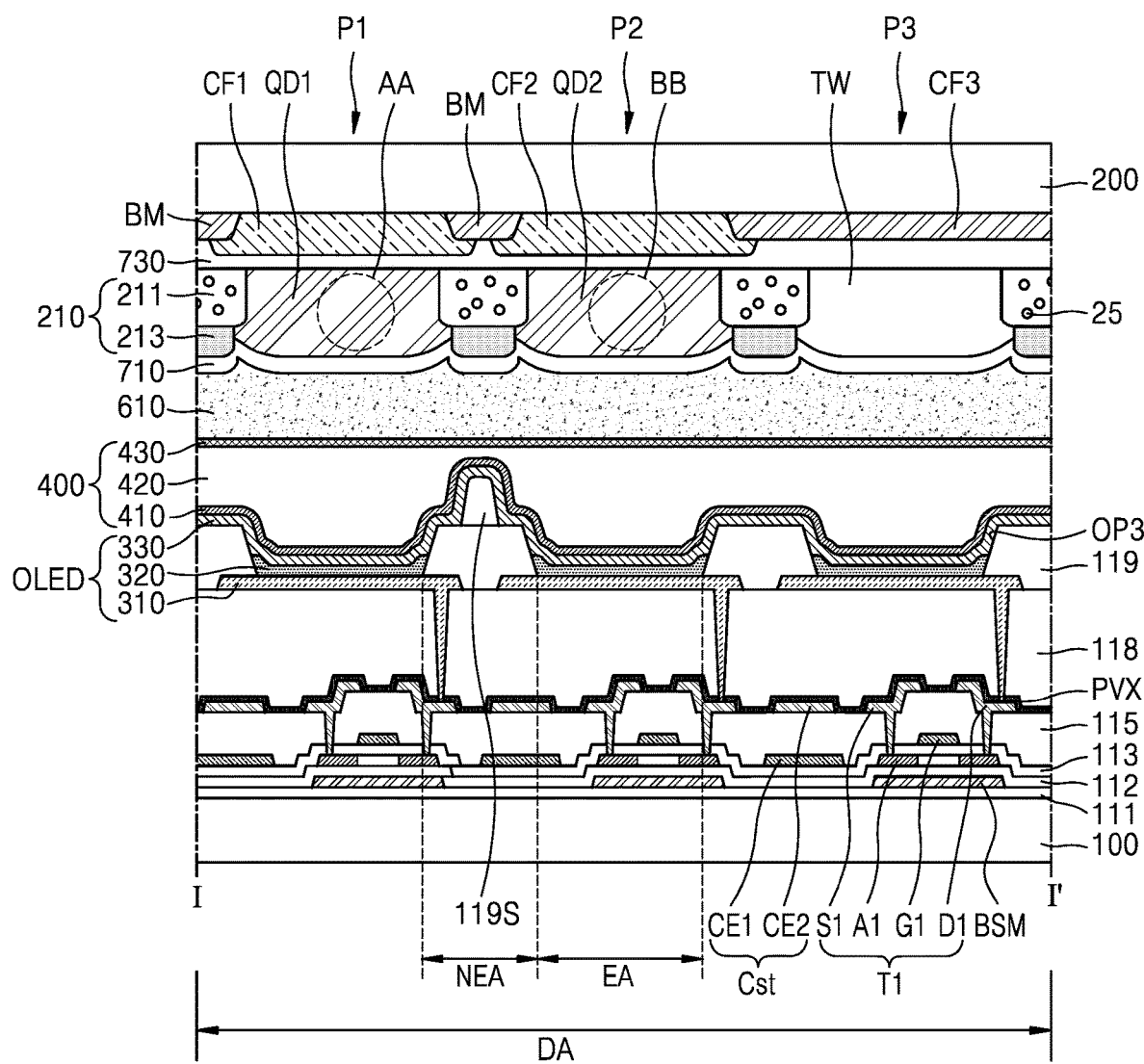
FIG. 3A is a cross-sectional view of an embodiment of a portion of a display area of a display apparatus according to the disclosure, and may correspond to line I-I' of FIG. 1A, and FIGS. 3B and 3C are enlarged views of portions AA and BB, respectively, of FIG. 3A.
Figure 3B:
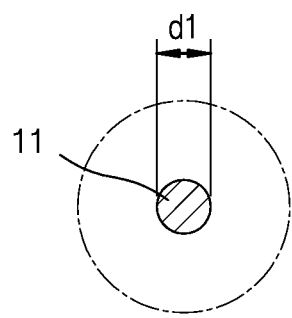
Figure 3C:
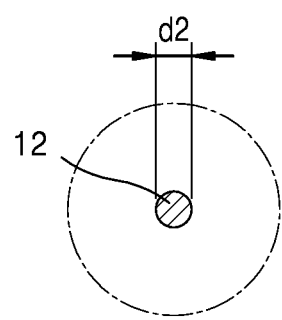
Figure 4:
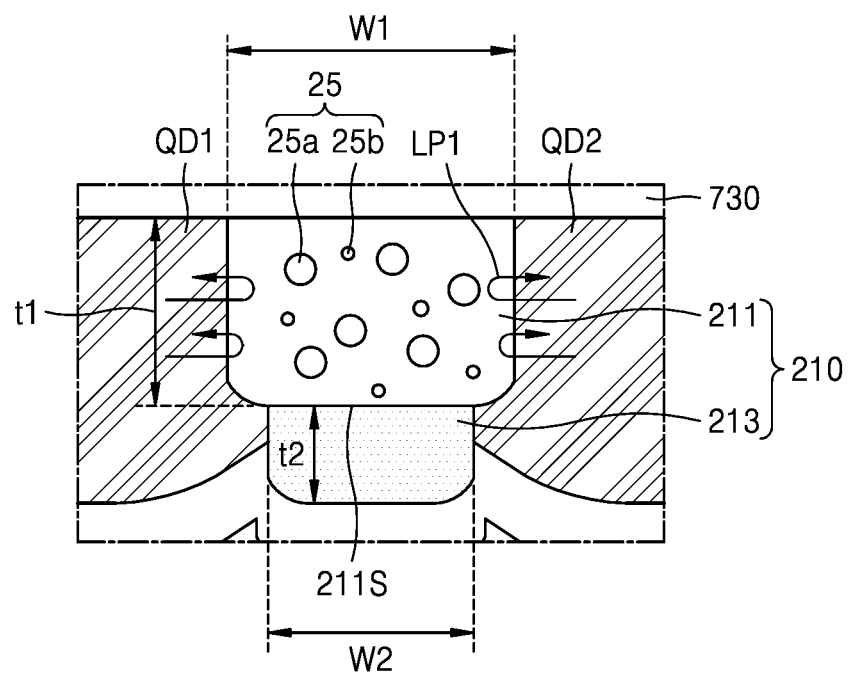
FIGS. 4 and 5 are enlarged views of a portion of FIG. 3A.
Figure 5:
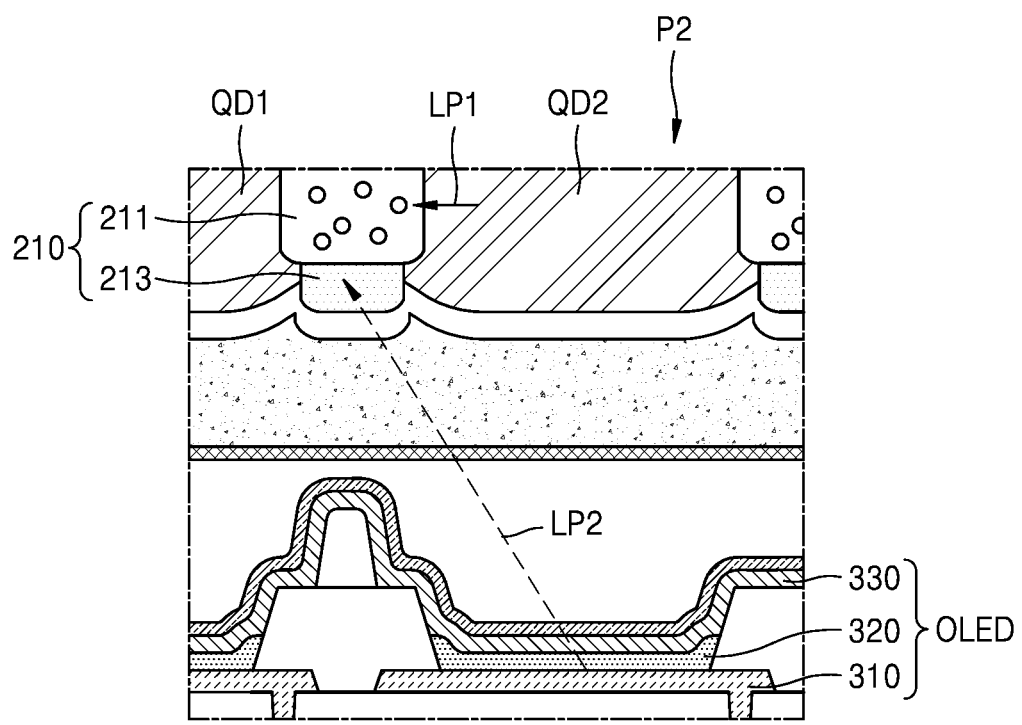

FIG. 3A is a cross-sectional view of an embodiment of a portion of the display area DA of a display apparatus according to the disclosure, and may correspond to a cross-section taken along line I-I' of FIG. 1A, and FIGS. 3B and 3C are enlarged views of portions AA and BB, respectively, of FIG. 3A. FIGS. 4 and 5 are enlarged views of a partition wall 210 of FIG. 3A.

Referring to FIG. 3A, in an embodiment, at least one thin-film transistor and a display device connected to the at least one thin-film transistor may be located on the display area DA of the display apparatus according to the disclosure.

In the display area DA of FIG. 3A, the driving thin-film transistor T1 and the storage capacitor Cst included in the pixel circuit PC of each pixel P described above with reference to FIGS. 2A and 2B are illustrated.

In the illustrated embodiment, the display area DA of the display apparatus includes a first pixel P1, a second pixel P2, and a third pixel P3, and each of the pixels P1, P2, and P3 includes an emission area EA. The emission area EA may be an area where light is generated and emitted to the outside. A non-emission area NEA may be located between the emission areas EA, and thus, the emission areas EA of the pixels P1, P2, and P3 may be divided by the non-emission areas NEA.

The first pixel P1, the second pixel P2, and the third pixel P3 may implement light of different colors. In an embodiment, the first pixel P1 may implement red light, the second pixel P2 may implement green light, and the third pixel P3 may implement blue light, for example. In a plan view, the emission area EA of each pixel may have various polygonal or circular shapes and various arrangements such as a stripe arrangement and a pentile arrangement.

The display apparatus in the illustrated embodiment may include a color conversion layer in correspondence with at least one pixel. In an embodiment, as in FIGS. 3A to 3C, a first color conversion layer QD1 and a second color conversion layer QD2 may correspond to the first pixel P1 and the second pixel P2, respectively, for example. The color conversion layers QD1 and QD2 may include quantum dots and scattering particles.

In an embodiment, the color conversion layers QD1 and QD2 may include the first color conversion layer QD1 included in the first pixel P1 and the second color conversion layer QD2 included in the second pixel P2, for example. The first color conversion layer QD1 may include a first quantum dot 11, and the second color conversion layer QD2 may include a second quantum dot 12.

A color conversion layer may not correspond to the emission area of the third pixel P3, and a transmissive window TW may be located in the emission area of the third pixel P3. The transmissive window TW may include an organic material from which light may be emitted without wavelength conversion of light emitted by the organic light-emitting diode OLED of the third pixel P3.

Organic light-emitting diodes OLED respectively included in the first pixel P1, the second pixel P2, and the third pixel P3 may emit the same color of light. In an embodiment, the organic light-emitting diodes OLED may emit blue light, for example.

Hereinafter, for convenience of explanation, components arranged in the display area DA of FIG. 3A are described according to a stacking order.

The substrate 100 may include a glass material, a ceramic material, a metal material, or a material having flexible or bendable characteristics. When the substrate 100 has flexible or bendable characteristics, the substrate 100 may include a polymer resin, such as polyethersulfone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide ("PI"), polycarbonate ("PC"), or cellulose acetate propionate ("CAP"). The substrate 100 may have a single-layered or multilayer structure of the material, and the multilayer structure may further include an inorganic layer. In some embodiments, the substrate 100 may have a structure of an organic material/inorganic material/organic material.

A barrier layer (not shown) may be further included between the substrate 100 and a first buffer layer 111. The barrier layer may prevent or minimize permeation of impurities from the substrate 100 and the like into a semiconductor layer A1. The barrier layer may include an inorganic material, such as an oxide or a nitride, an organic material, or an organic and inorganic compound, and may have a single-layered or multilayer structure of an inorganic material and an organic material.

The bias electrode BSM may be located on the first buffer layer 111 to correspond to the driving thin-film transistor T1. A voltage may be applied to the bias electrode BSM. In an embodiment, the bias electrode BSM may be connected to the source electrode S3 (refer to FIG. 2B) of the sensing thin-film transistor T3 (refer to FIG. 2B), and thus, a voltage of the source electrode S3 may be applied to the bias electrode BSM, for example. Also, the bias electrode BSM may prevent external light from reaching the semiconductor layer A1. Accordingly, characteristics of the driving thin-film transistor T1 may be stabilized. In some cases, the bias electrode BSM may be omitted.

The semiconductor layer A1 may be located on a second buffer layer 112. The semiconductor layer A1 may include amorphous silicon or polysilicon. In another embodiment, the semiconductor layer A1 may include an oxide of at least one material selected from the group including indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In some embodiments, the semiconductor layer A1 may include a Zn oxide, an In—Zn oxide, a Ga—In—Zn oxide, or the like as a Zn oxide-based material. In another embodiment, the semiconductor layer A1 may be an In—Ga—Zn—O ("IGZO"), In—Sn—Zn—O ("ITZO"), or In—Ga—Sn—Zn—O ("IGTZO") semiconductor including a metal, such as In, Ga, or Sn, in ZnO. The semiconductor layer A1 may include a channel region, and a source region and a drain region respectively arranged on both sides of the channel region. The semiconductor layer A1 may be formed as a single layer or a multilayer.

The gate electrode G1 is located on the semiconductor layer A1 with a gate insulating layer 113 therebetween, and at least a portion of the gate electrode G1 overlaps the semiconductor layer A1. The gate electrode G1 may include molybdenum (Mo), Al, copper (Cu), or Ti, and may be formed as a single layer or a multilayer. In an embodiment, the gate electrode G1 may be a single layer of Mo. The first electrode CE1 of the storage capacitor Cst may be located on the same layer as the gate electrode G1. The first electrode CE1 may include the same material as that of the gate electrode G1, for example.

An inter-insulating layer 115 may be provided to cover the gate electrode G1 and the first electrode CE1 of the storage capacitor Cst. The inter-insulating layer 115 may include a silicon oxide ($SiO_x$), a silicon nitride ($SiN_x$), a silicon oxynitride (SiON), an aluminum oxide ($Al_2O_3$), a titanium oxide ($TiO_2$), a tantalum oxide ($Ta_2O_5$), a hafnium oxide ($HfO_2$), or a zinc oxide ($ZnO_2$).

The second electrode CE2 of the storage capacitor Cst, the source electrode S1, the drain electrode D1, and the data line DL may be arranged over the inter-insulating layer 115.

The second electrode CE2 of the storage capacitor Cst, the source electrode S1, the drain electrode D1, and the data line DL may include a conductive material including Mo, Al, Cu, and Ti, and may be formed as a multilayer or a single layer, which includes the material. In an embodiment, each of the second electrode CE2, the source electrode S1, the drain electrode D1, and the data line DL may have a multilayer structure of Ti/Al/Ti, for example. The source electrode S1 and the drain electrode D1 may be connected to the source region or the drain region of the semiconductor layer A1 through a contact hole.

The second electrode CE2 of the storage capacitor Cst overlaps the first electrode CE1 with the inter-insulating layer 115 therebetween, and forms a capacitance. In this case, the inter-insulating layer 115 may function as a dielectric layer of the storage capacitor Cst.

The second electrode CE2 of the storage capacitor Cst, the source electrode S1, the drain electrode D1, and the data line DL may be covered by an inorganic passivation layer PVX.

The inorganic passivation layer PVX may be a single layer or a multilayer of $SiN_x$ and $SiO_x$. The inorganic passivation layer PVX may be introduced to cover and protect some wires arranged on the inter-insulating layer 115. Wires (not shown) formed together with the data line DL in the same process may be exposed in a partial area (for example, a portion of a peripheral area) of the substrate 100. Exposed portions of the wires may be damaged by an etchant that is used to pattern a pixel electrode 310 which will be described below. However, because the inorganic passivation layer PVX covers the data line DL and at least a portion of the wires formed together with the data line DL as in the illustrated embodiment, the wires may be prevented from being damaged during a process of patterning the pixel electrode 310.

A planarization layer 118 may be located on the inorganic passivation layer PVX, and the organic light-emitting diode OLED may be located on the planarization layer 118.

The planarization layer 118 may be a layer including an organic material, which may be formed as a single layer or a multilayer, and provides a flat upper surface. The planarization layer 118 may include a commercial polymer, such as benzocyclobutene ("BCB"), PI, hexamethyldisiloxane ("HMDSO"), polymethylmethacrylate ("PMM"), or polystyrene ("PS"), a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, and any combinations thereof.

In the display area DA of the substrate 100, the organic light-emitting diode OLED is located on the planarization layer 118. The organic light-emitting diode OLED includes the pixel electrode 310, an intermediate layer 320 including an organic emission layer, and an opposite electrode 330.

The pixel electrode 310 may be a (semi-)light-transmissive electrode or a reflective electrode. In some embodiments, the pixel electrode 310 may include a reflective layer including silver (Ag), magnesium (Mg), Al, platinum (Pt), palladium (Pd), gold (Au), nickel (Ni), neodymium (Nd), iridium (Ir), Cr, and a compound thereof, and a transparent or semi-transparent electrode layer formed on the reflective layer. The transparent or semi-transparent electrode layer may include at least one selected from the group including an indium tin oxide ("ITO"), an indium zinc oxide ("IZO"), a zinc oxide (ZnO), an indium oxide ($In_2O_3$), an indium gallium oxide ("IGO"), and an aluminum zinc oxide ("AZO"). In some embodiments, the pixel electrode 310 may have a structure of ITO/Ag/ITO.

A pixel-defining layer 119 may be located on the planarization layer 118, and the pixel-defining layer 119 may define an opening corresponding to each of subpixels, that is, a third opening OP3 through which at least a central portion of the pixel electrode 310 is exposed, in the display area DA, and accordingly, may define an emission area of a pixel. Also, the pixel-defining layer 119 may prevent an arc or the like from occurring on an edge of the pixel electrode 310 by increasing a distance between the edge of the pixel electrode 310 and the opposite electrode 330 over the pixel electrode 310.

The pixel-defining layer 119 may include at least one organic insulating material selected from the group including PI, polyamide, an acrylic resin, BCB, and a phenolic resin, by using a method such as spin coating.

The intermediate layer 320 of the organic light-emitting diode OLED may include the organic emission layer. The organic emission layer may include an organic material including a fluorescent or phosphorescent material emitting red, green, blue, or white light. The organic emission layer may include a low molecular weight organic material or a polymer organic material, and a functional layer, such as a hole transport layer ("HTL"), a hole injection layer ("HIL"), an electron transport layer ("ETL"), and an electron injection layer ("EIL"), may selectively be further located under and over the organic emission layer. The intermediate layer 320 may be located to correspond to each of the pixel electrodes 310. However, the disclosure is not limited thereto. The intermediate layer 320 may have various modifications. In an embodiment, the intermediate layer 320 may include a layer that is integrally formed over the pixel electrodes 310, for example.

In the drawing, the intermediate layer 320 is separately provided for each of the pixels P1, P2, and P3, but the disclosure is not limited thereto. The intermediate layer 320 may be integrally formed in each of the pixels P1, P2, and P3.

In the illustrated embodiment, the organic light-emitting diodes OLED respectively included in the first pixel P1, the second pixel P2, and the third pixel P3 may respectively include organic emission layers that emit the same color. In an embodiment, each of the organic light-emitting diodes OLED respectively included in the first pixel P1, the second pixel P2, and the third pixel P3 may emit blue light, for example.

The opposite electrode 330 may be a light-transmissive electrode or a reflective electrode. In some embodiments, the opposite electrode 330 may be a transparent or semi-transparent electrode, and may include a metal thin film having a small work function, which includes lithium (Li), calcium (Ca), lithium fluoride (LiF)/Ca, LiF/Al, Al, Ag, Mg, and a compound thereof. Also, a transparent conductive oxide ("TCO") layer, such as ITO, IZO, ZnO, or $In_2O_3$, may be further located on the metal thin film. The opposite electrode 330 may be arranged across the display area DA and the peripheral area PA, and may be located over the intermediate layer 320 and the pixel-defining layer 119. The opposite electrode 330 may be integrally formed with respect to the organic light-emitting diodes OLED to correspond to the pixel electrodes 310.

A spacer 119S for preventing mask imprinting may be further included on the pixel-defining layer 119. The spacer 119S may be formed integrally with the pixel-defining layer 119. In an embodiment, the spacer 119S and the pixel-defining layer 119 may be simultaneously formed in the same process by using a halftone mask process, for example.

The organic light-emitting diode OLED may be easily damaged by moisture, oxygen, or the like from the outside, and thus may be covered and protected by the thin-film encapsulation layer 400. The thin-film encapsulation layer 400 may cover the display area DA and may extend beyond the display area DA. The thin-film encapsulation layer 400 may include at least one organic encapsulation layer and at least one inorganic encapsulation layer. In an embodiment, the thin-film encapsulation layer 400 may include a first inorganic encapsulation layer 410, an organic encapsulation layer 420, and a second inorganic encapsulation layer 430, for example.

The first inorganic encapsulation layer 410 may cover the opposite electrode 330, and may include a silicon oxide, a silicon nitride, and/or a silicon oxynitride. Although not shown, as desired, other layers, such as a capping layer, may be located between the first inorganic encapsulation layer 410 and the opposite electrode 330. Because the first inorganic encapsulation layer 410 is formed along a structure below the first inorganic encapsulation layer 410, an upper surface thereof is not flat. The organic encapsulation layer 420 covers the first inorganic encapsulation layer 410, and unlike the first inorganic encapsulation layer 410, may include an approximately flat upper surface. In detail, a portion of the organic encapsulation layer 420, which corresponds to the display area DA, may include an approximately flat upper surface. The organic encapsulation layer 420 may include at least one material selected from the group including PET, PEN, PC, PI, polyethylene sulfonate, polyoxymethylene, polyarylate, and HMDSO. The second inorganic encapsulation layer 430 covers the organic encapsulation layer 420, and may include a silicon oxide, a silicon nitride, and/or a silicon oxynitride.

Even when cracks occur in the thin-film encapsulation layer 400 due to the above-described multilayer structure, the thin-film encapsulation layer 400 may allow the cracks not to be connected between the first inorganic encapsulation layer 410 and the organic encapsulation layer 420 or between the organic encapsulation layer 420 and the second inorganic encapsulation layer 430. Accordingly, formation of a path via which moisture, oxygen, or the like from the outside permeates into the display area DA may be prevented or minimized.

A filler 610 may be located over the thin-film encapsulation layer 400. The filler 610 may function as a buffer against external pressure or the like. The filler 610 may include an organic material, such as methyl silicone, phenyl silicone, or PI. However, the disclosure is not limited thereto, and the filler 610 may also include an organic sealant such as a urethane-based resin, an epoxy-based resin, an acrylic resin, or an inorganic sealant such as silicon.

A first color filter CF1, a second color filter CF2, and a third color filter CF3 and a light-blocking pattern BM may be provided on the upper substrate 200 located to face the substrate 100. The color filters CF1, CF2, and CF3 may be introduced to realize a full-color image and improve a color purity and outdoor visibility. The first color filter CF1 may be implemented with the same color as that of light emitted from the first color conversion layer QD1, the second color filter CF2 may be implemented with the same color as that of light emitted from the second color conversion layer QD2, and the third color filter CF3 may be implemented with the same color as that of light emitted from the organic light-emitting diode OLED.

The light-blocking pattern BM may be located between the first to third color filters CF1, CF2, and CF3 to correspond to the non-emission area NEA. The light-blocking pattern BM may be a member for improving color clarity and contrast, as a black matrix. The light-blocking pattern BM may include at least one of a black pigment, a black dye, and black particles. In some embodiments, the light-blocking pattern BM may include Cr, CrOx, Cr/CrOx, Cr/CrOx/CrNy, a resin (for example, a carbon pigment or an RGB mixed pigment), graphite, or a non-Cr-based material. In some embodiments, the light-blocking pattern BM may be formed by overlapping at least two of the first color filter CF1, the second color filter CF2, and the third color filter CF3. In an embodiment, the third color filter CF3 is located between the first pixel P1 and the second pixel P2, and portions of the first color filter CF1 and the second color filter CF2 overlap the third color filter CF3, thereby functioning as the light-blocking pattern BM, for example.

In the illustrated embodiment, the organic light-emitting diode OLED is employed as a display element, but embodiments of the disclosure are not limited thereto. In an embodiment, the display element may include a micro-sized or nano-sized ILED, for example.

In the illustrated embodiment, the color conversion layers QD1 and QD2, the transmissive window TW, and the partition wall 210 may be located between the organic light-emitting diode OLED, which is a display element located on the substrate 100, and the upper substrate 200.

The color conversion layers QD1 and QD2 may respectively include the first quantum dot 11 and the second quantum dot 12. The first quantum dot 11 and the second quantum dot 12 have unique excitation and emission characteristics depending on materials and sizes thereof, and thus may convert incident light into certain color light. Various materials may be employed to form the first quantum dot 11 and the second quantum dot 12. In an embodiment, the first quantum dot 11 and the second quantum dot 12 may be selected from a Group II-VI compound, a Group III-V compound, a Group IV-VI compound, a Group IV element, a Group IV compound, and any combinations thereof.

The Group II-VI compound may be selected from the group including: a binary compound selected from the group including CdSe, CdTe, ZnS, ZnSe, ZnTe, ZnO, HgS, HgSe, HgTe, MgSe, MgS, and any combinations thereof; a ternary compound selected from the group including CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any combinations thereof; and a quaternary compound selected from the group including HgZnTeS, CdZnSeS, CdZnSeTe, CdZnSTe, CdHgSeS, CdHgSeTe, CdHgSTe, HgZnSeS, HgZnSeTe, HgZnSTe, and any combinations thereof. The Group III-V compound may be selected from the group including: a binary compound selected from the group including GaN, GaP, GaAs, GaSb, AlN, AlP, AlAs, AlSb, InN, InP, InAs, InSb, and any combinations thereof; a ternary compound selected from the group including GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and any combinations thereof; and a quaternary compound selected from the group including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any combinations thereof. The Group IV-VI compound may be selected from the group including: a binary compound selected from the group including SnS, SnSe, SnTe, PbS, PbSe, PbTe, and any combinations thereof; a ternary compound selected from the group including SnSeS, SnSeTe, SnSTe, PbSeS, PbSeTe, PbSTe, SnPbS, SnPbSe, SnPbTe, and any combinations thereof; and a quaternary compound selected from the group including SnPbSSe, SnPbSeTe, SnPbSTe, and any combinations thereof. The Group IV element may be selected from the group including Si, Ge, and any combinations thereof. The Group IV compound may be a binary compound selected from the group including SiC, SiGe, and any combinations thereof.

In this regard, the binary compound, the ternary compound, or the quaternary compound may be present in particles at a uniform concentration, or may have a concentration distribution partially divided into different states within the same particle.

Each of the first quantum dot 11 and the second quantum dot 12 may have a core-shell structure having a core and a shell. An interface between the core and the shell may have a concentration gradient in which the concentration of elements present in the shell decreases toward the center of the quantum dot. The shell of the quantum dot may act as a passivation layer to prevent chemical degeneration of the core to maintain semiconductor characteristics and/or as a charging layer to impart electrophoretic characteristics to the quantum dot. The shell may be a single layer or a multilayer. In an embodiment, the shell of each of the first quantum dot 11 and the second quantum dot 12 may include an oxide of metal or non-metal, a semiconductor compound, or any combinations thereof.

In an embodiment, the oxide of metal or non-metal may include a binary compound, such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, or $NiO$, or a ternary compound, such as $MgAl_2O_4$, $CoFe_2O_4$, $NiFe_2O_4$, or $CoMn_2O_4$, but the disclosure is not limited thereto.

In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, but the disclosure is not limited thereto.

Each of the first quantum dot 11 and the second quantum dot 12 may have a size of about 45 nanometer (nm) or less, e.g., about 40 nm or less, or, e.g., about 30 nm or less, and in this range, the color purity or the color reproducibility may be improved. Also, because light emitted through these quantum dots is emitted in all directions, the wide viewing angle may be improved.

Also, the shapes of the first quantum dot 11 and the second quantum dot 12 are not particularly limited to shapes generally used in the art, but the first quantum dot 11 and the second quantum dot 12 may each be a spherical particle, a pyramidal particle, a multi-arm particle, a cubic nanoparticle, a nanotube particle, a nanowire particle, a nanofiber particle, a nanoplate particle.

The core of each of the first quantum dot 11 and the second quantum dot 12 may have a diameter of about 2 nm to about 10 nm, and when the first quantum dot 11 and the second quantum dot 12 are exposed to light, light of a specific frequency may be emitted according to sizes of the particles and types of materials. Thus, an average size of the first quantum dots 11 and an average size of the second quantum dots 12 may be different from each other. In an embodiment, as the size of the quantum dot increases, the color of a long wavelength may be emitted, for example. Accordingly, the size of the quantum dot may be selected in accordance with the colors of the first pixel P1 and the second pixel P2.

In the illustrated embodiment, the organic light-emitting diodes OLED respectively included in the pixels P1, P2, and P3 may emit light of the same wavelength, and the colors of the first pixel P1 and the second pixel P2 may be determined to be colors respectively emitted by the first quantum dot 11 and the second quantum dot 12. Because a color conversion layer that corresponds the emission area EA of the third pixel P3 is not provided, the color of the third pixel P3 may be determined to be a color emitted by the organic light-emitting diode OLED. In an embodiment, the organic light-emitting diode OLED may emit light of a blue wavelength, and the first pixel P1 may implement a red color, the second pixel P2 may implement a green color, and the third pixel P3 may implement a blue color, for example.

Accordingly, the first quantum dot 11 and the second quantum dot 12 may have different materials and/or different sizes. In some embodiments, materials of the first quantum dot 11 and the second quantum dot 12 may be the same as each other, and sizes of the first quantum dot 11 and the second quantum dot 12 may be different from each other. In an embodiment, a diameter d1 of the first quantum dot 11 may be greater than a diameter d2 of the second quantum dot 12 (d1>d2), for example.

Because the first quantum dot 11 includes a plurality of first quantum dots 11 and the second quantum dot 12 includes a plurality of second quantum dots 12, an average size of the first quantum dots 11 may be different from an average size of the second quantum dots 12.

In some embodiments, the core of each of the first quantum dot 11 and the second quantum dot 12 may include CdSe. In this case, an average size, e.g., an average diameter d1, of the cores of the first quantum dots 11 may be about 5 nm, and an average diameter d2 of the cores of the second quantum dots 12 may be about 3 nm.

The color conversion layers QD1 and QD2 may further include, in addition to the quantum dots, various materials to mix and appropriately disperse the quantum dots. In an embodiment, the color conversion layers QD1 and QD2 may further include a solvent, a photoinitiator, a binder polymer, and a dispersant, for example.

A color conversion layer may not correspond to the emission area of the third pixel P3, and the transmissive window TW may be located in the emission area of the third pixel P3. The transmissive window TW may include an organic material from which light may be emitted without wavelength conversion of light emitted by the organic light-emitting diode OLED of the third pixel P3.

The partition wall 210 may be located between the first color conversion layer QD1, the second color conversion layer QD2, and the transmissive window TW to correspond to the non-emission area NEA. In detail, the partition wall 210 may be located between the first color conversion layer QD1 and the second color conversion layer QD2, between the second color conversion layer QD2 and the transmissive window TW, and the like.

In the illustrated embodiment, the partition wall 210 includes an organic material, a first pigment, and partition wall-scattering particles 25. In some embodiments, the partition wall 210 may include a stack of a first partition wall layer 211 including the partition wall-scattering particles 25 and a second partition wall layer 213 including the first pigment. The first partition wall layer 211 may include an organic material having a high light transmittance, and the partition wall-scattering particles 25. The second partition wall layer 213 may include an organic material including the first pigment. Accordingly, the light transmittance of the first partition wall layer 211 may be greater than the light transmittance of the second partition wall layer 213. In this case, the second partition wall layer 213 may be located to the organic light-emitting diode OLED than the first partition wall layer 211 is.

The organic materials constituting the first partition wall layer 211 and the second partition wall layer 213 may include a commercial polymer, such as BCB, PI, HMDSO, PMM, or PS, a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, and any combinations thereof.

The partition wall-scattering particles 25 included in the first partition wall layer 211 may reflect or scatter light incident toward the partition wall 210 from the color conversion layers QD1 and QD2 and the transmissive window TW. The first pigment included in the second partition wall layer 213 may block or absorb light incident from the organic light-emitting diode OLED included in an adjacent pixel.

A first passivation layer 710 and a second passivation layer 730 may be respectively provided under and over the color conversion layers QD1 and QD2, the transmissive window TW, and the partition wall 210. The first passivation layer 710 and the second passivation layer 730 may protect the color conversion layers QD1 and QD2 and the transmissive window TW from being contaminated by other components arranged under and over the color conversion layers QD1 and QD2 and the transmissive window TW. Each of the first passivation layer 710 and the second passivation layer 730 may include an inorganic insulating material. In an embodiment, the first passivation layer 710 and/or the second passivation layer 730 may include $SiO_2$, $SiN_x$, SiON, $Al_2O_3$, $TiO_2$, $Ta_2O_5$, $HfO_2$, or $ZnO_2$, for example.

Referring to FIGS. 4 and 5, light emitted from the first color conversion layer QD1 and the second color conversion layer QD2 is emitted through the quantum dots, and may be emitted in all directions. Among the light, light LP1 traveling toward the first partition wall layer 211 may be reflected by the partition wall-scattering particles 25 included in the first partition wall layer 211 and may be incident on the first color conversion layer QD1 and the second color conversion layer QD2. Because the reflected light may excite the quantum dots again, the light efficiency may be improved. In other words, the light reflected from the first partition wall layer 211 may be reused in the color conversion layers QD1 and QD2, and thus, the light efficiency may be improved. When the light entering the first partition wall layer 211 is reflected without loss of light, the reusability of light may increase. Thus, the organic material constituting the first partition wall layer 211 may have a high light transmittance.

The partition wall-scattering particle 25 may have a material and size that enable light in the visible light region to be reflected and/or scattered. In an embodiment, the partition wall-scattering particle 25 may include $TiO_2$, ZnO, a hollow silica particle, or the like, for example. The partition wall-scattering particle 25 may have a size of ½ of a wavelength of incident light to efficiently reflect the light. Accordingly, a diameter of the partition wall-scattering particle 25 may be about 200 nm to about 400 nm.

In some embodiments, the partition wall-scattering particle 25 may include a first partition wall-scattering particles 25a and a second partition wall-scattering particles 25b. The first partition wall-scattering particles 25a may have a material and size that enable light emitted from the first color conversion layer QD1 to be efficiently reflected and/or scattered. The second partition wall-scattering particles 25b may have a material and size that enable light emitted from the second color conversion layer QD2 to be efficiently reflected and/or scattered.

When the first color conversion layer QD1 emits red light and the second color conversion layer QD2 emits green light, a diameter of the first partition wall-scattering particles 25a may be greater than a diameter of the second partition wall-scattering particles 25b. In some embodiments, an average diameter of the first partition wall-scattering particles 25a may be about 330 nm to about 360 nm, and an average diameter of the second partition wall-scattering particles 25b may be about 250 nm to about 280 nm. The partition wall-scattering particle 25 may further include a third partition wall-scattering particle having a size that enables blue light to be efficiently reflected/scattered. In this case, an average diameter of the third partition wall-scattering particles may be about 220 nm to about 240 nm.

An amount of the partition wall-scattering particle 25 included in the first partition wall layer 211 may be about 5 wt % to about 20 wt % based on a weight of the first partition wall layer 211. When an amount of the partition wall-scattering particle 25 is less than about 5 wt %, reflection by the partition wall-scattering particle 25 may not occur efficiently. When an amount of the partition wall-scattering particle 25 is greater than about 20 wt %, an amount of the organic material included in the first partition wall layer 211 may relatively decrease. The organic material flattens an upper surface 211S of the first partition wall layer 211, which faces the substrate 100, and thus, when an amount of the organic material decreases, the upper surface 211S of the first partition wall layer 211 may be curved rather than being flat. When the upper surface 211S of the first partition wall layer 211 is not flat, a defect may occur when the second partition wall layer 213 is formed thereon. In the illustrated embodiment, an amount of the partition wall-scattering particle 25 may be about 20 wt % or less, so that the first partition wall layer 211 includes a flat upper surface 211S.

Because the first partition wall layer 211 includes the organic material having a high light transmittance, despite the presence of the partition wall-scattering particle 25, light LP2 generated from the organic light-emitting diode OLED included in an adjacent pixel may not be efficiently blocked by the first partition wall layer 211.

In the illustrated embodiment, the second partition wall layer 213 is introduced to increase a blocking rate of the adjacent light LP2. In other words, the light transmittance of the second partition wall layer 213 may be less than the light transmittance of the first partition wall layer 211.

The second partition wall layer 213 may include an organic material including the first pigment. The first pigment may have a color complementary to the color of light emitted from the organic light-emitting diode OLED. In an embodiment, when the organic light-emitting diode OLED emits blue light, the first pigment may be yellow, for example. An amount of the first pigment may be provided in an amount sufficient to absorb blue light.

The second partition wall layer 213 may include a liquid-repellent material. The color conversion layers QD1 and QD2 and the transmissive window TW may be formed by an inkjet coating method after the partition wall 210 is formed on the side of the upper substrate 200. In this case, overflow of the organic materials forming the color conversion layers QD1 and QD2 and the transmissive window TW may be prevented by including the liquid-repellent material in the second partition wall layer 213.

In some embodiments, a thickness t1 of the first partition wall layer 211 toward the substrate 100 may be greater than a thickness t2 of the second partition wall layer 213. As the thickness t1 of the first partition wall layer 211 increases, the reusability of light increases. Thus, the thickness t1 of the first partition wall layer 211 may be greater than the thickness t2 of the second partition wall layer 213. The thickness of the first partition wall layer 211 may be about 8 micrometers ($\mu$m) to about 12 $\mu$m, and the thickness of the second partition wall layer 213 may be about 4 $\mu$m to about 6 $\mu$m.

Although FIGS. 3A to 5 illustrate that a width W1 of the first partition wall layer 211 in a direction parallel to an upper surface of the substrate 100 may be greater than a width W2 of the second partition wall layer 213, the disclosure is not limited thereto.

Figure 6A:
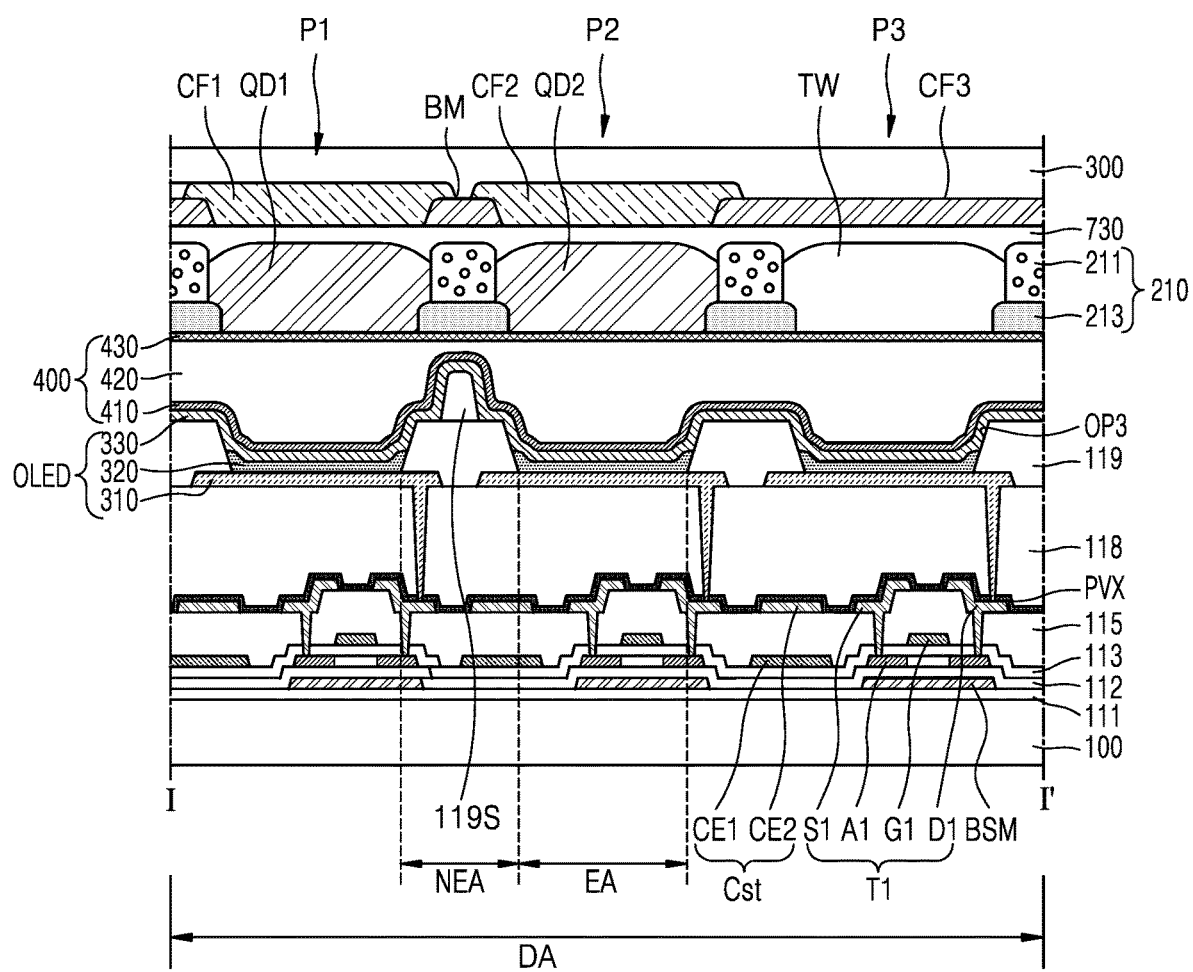
FIGS. 6A to 7B are schematic cross-sectional views of embodiments of a portion of a display apparatus according to the disclosure.
Figure 6B:
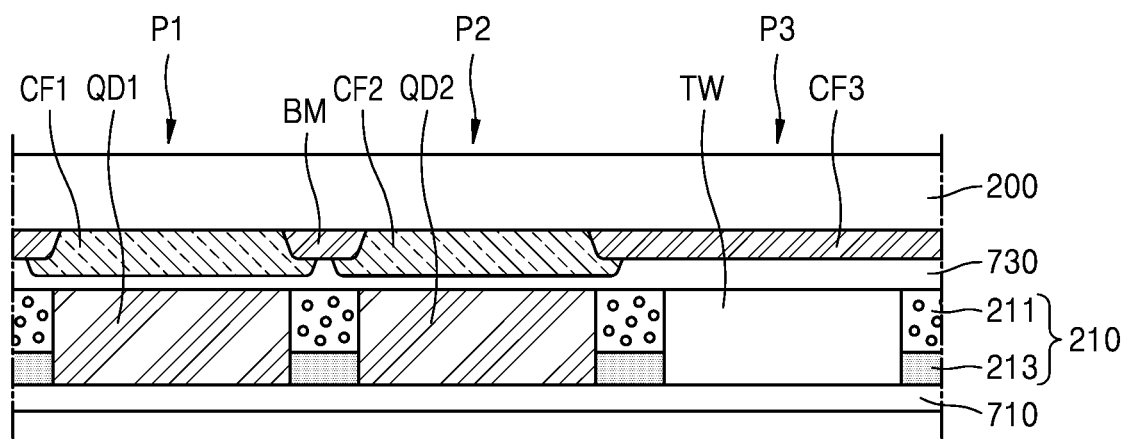

FIGS. 6A and 6B are cross-sectional views of part of embodiments of the disclosure. The same reference numerals in FIG. 3A and FIGS. 6A and 6B denote the same members, and thus, repeated descriptions thereof are omitted.

Referring to FIG. 6A, the display apparatus includes the partition wall 210 located between the first color conversion layer QD1 and the second color conversion layer QD2 and including the partition wall-scattering particles 25 and the first pigment. The partition wall 210 may include a stack of the first partition wall layer 211 and the second partition wall layer 213.

In the illustrated embodiment, the partition wall 210 may be formed over the thin-film encapsulation layer 400 (refer to FIG. 3A). In other words, the second partition wall layer 213 is formed on the thin-film encapsulation layer 400, and then the first partition wall layer 211 is formed on the second partition wall layer 213, thereby forming the partition wall 210. Next, the color conversion layers QD1 and QD2 and the transmissive window TW may be formed between the partition walls 210 by an inkjet coating method. In this case, the upper substrate 200 and/or the filler 610 used in the embodiment described with reference to FIG. 3A may be omitted, and an upper passivation layer 300 may be located on the color filters CF1, CF2, and CF3. In the illustrated embodiment, the width W2 of the second partition wall layer 213 may be greater than the width W1 of the first partition wall layer 211.

Referring to FIG. 6B, the widths of the first partition wall layer 211 and the second partition wall layer 213 may be the same as each other, or a step may not be formed between the first partition wall layer 211 and the second partition wall layer 213. The partition wall 210 of the illustrated embodiment may be formed by sequentially stacking and then simultaneously patterning the organic materials forming the first partition wall layer 211 and the second partition wall layer 213.

Figure 7A:
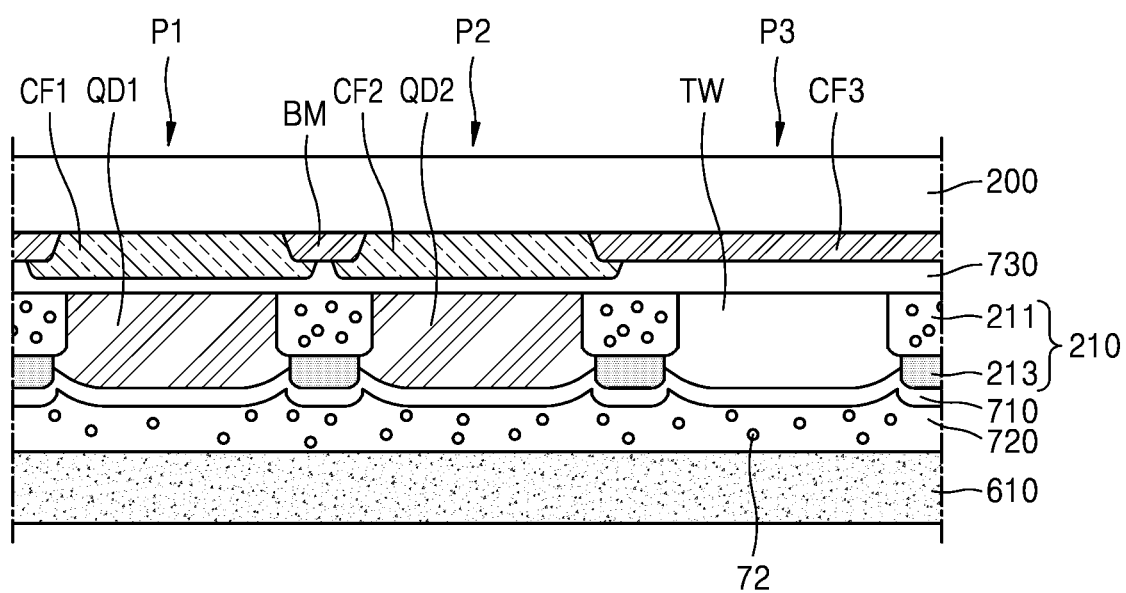
Figure 7B:
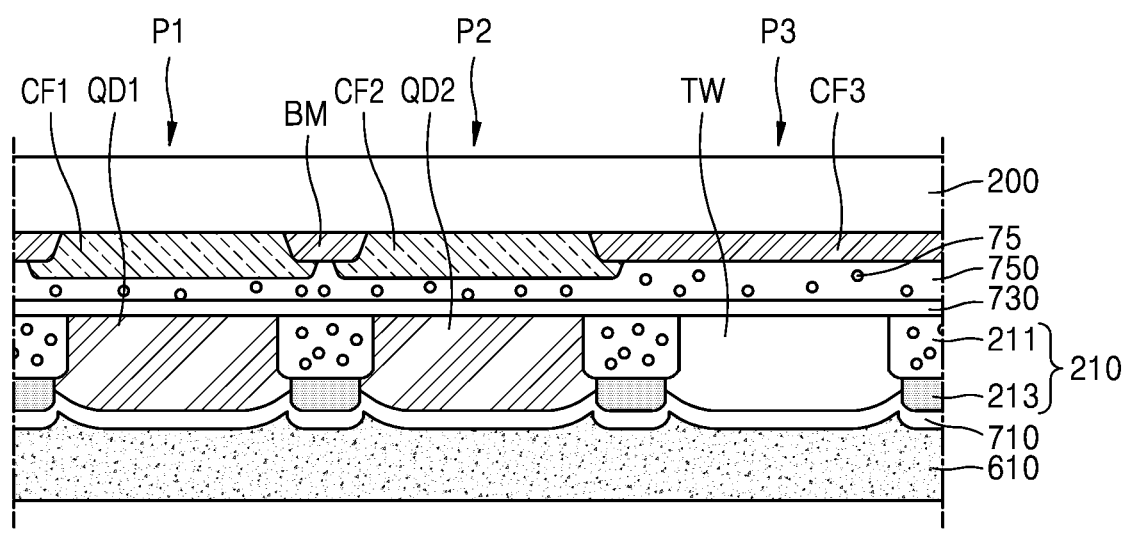

FIGS. 7A and 7B are cross-sectional views of part of embodiments of the disclosure. The same reference numerals in FIG. 3A and FIGS. 7A and 7B denote the same members, and thus, repeated descriptions thereof are omitted.

Referring to FIG. 7A, a lower scattering particle layer 720 may be further located under the color conversion layers QD1 and QD2 and the transmissive window TW. The lower scattering particle layer 720 may be located between the first passivation layer 710 and the filler 610.

The lower scattering particle layer 720 may include an organic material having a high light transmittance, which includes lower-scattering particles 72. The lower scattering particle layer 720 may reflect light emitted toward the substrate 100 and increase the reusability of the light.

The organic material included in the lower scattering particle layer 720 may include a commercial polymer, such as BCB, PI, HMDSO, PMM, or PS, a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, and any combinations thereof.

The lower-scattering particle 72 may include $TiO_2$, ZnO, a hollow silica particle, or the like. A diameter of the lower-scattering particle 72 may be about 200 nm to about 400 nm.

An amount of the lower-scattering particle 72 included in the lower scattering particle layer 720 may be about 5 wt % to about 12 wt % based on a weight of the lower scattering particle layer 720. The transmittance of light, which is emitted from the organic light-emitting diode OLED, by the lower scattering particle layer 720 should be considered. Thus, an amount of the lower-scattering particle 72 included in the lower scattering particle layer 720 may be less than an amount of the partition wall-scattering particle 25.

Referring to FIG. 7B, an upper scattering particle layer 750 may be further located over the color conversion layers QD1 and QD2 and the transmissive window TW. The upper scattering particle layer 750 may be located between the second passivation layer 730 and the color filters CF1, CF2, and CF3.

The upper scattering particle layer 750 may include an organic material having a high light transmittance, which includes upper-scattering particles 75. The upper scattering particle layer 750 may reflect light emitted toward the upper substrate 200 and increase the reusability of the light.

The organic material included in the upper scattering particle layer 750 may include a commercial polymer, such as BCB, PI, HMDSO, PMM, or PS, a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, and any combinations thereof.

An amount of the upper-scattering particle 75 included in the upper scattering particle layer 750 may be about 5 wt % to about 12 wt % based on a weight of the upper scattering particle layer 750. The transmittance of light, which is emitted to the outside, of the upper scattering particle layer 750 should be considered. Thus, an amount of the upper-scattering particle 75 included in the upper scattering particle layer 750 may be less than an amount of the partition wall-scattering particle 25.

Figure 8:
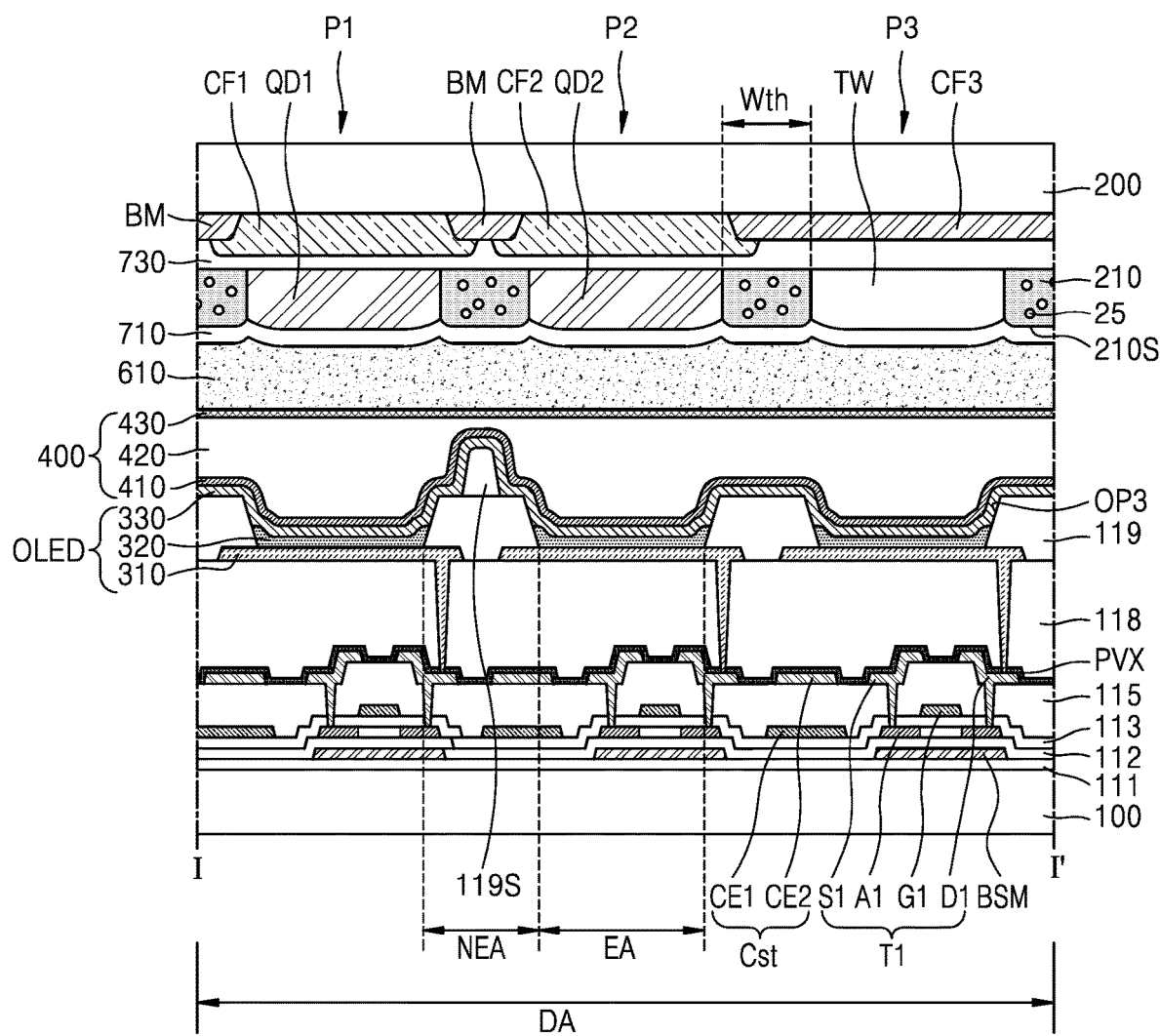
FIG. 8 is a schematic cross-sectional view of an embodiment of a display apparatus according to the disclosure.

FIG. 8 is a schematic cross-sectional view of an embodiment of a display apparatus according to the disclosure. The same reference numerals in FIGS. 3A and 8 denote the same members, and thus, repeated descriptions thereof are omitted.

Referring to FIG. 8, the display apparatus in the illustrated embodiment includes the first pixel P1, the second pixel P2, and the third pixel P3, and the color conversion layers QD1 and QD2 and/or the transmissive window TW may be located to correspond to each pixel. Also, the partition wall 210 including an organic material is located between the color conversion layers QD1 and QD2 and/or the transmissive window TW of the display apparatus, and the partition wall 210 includes the partition wall-scattering particles 25 and the first pigment.

In the illustrated embodiment, the partition wall 210 may be provided as a single layer rather than a double layer. In this case, the partition wall-scattering particles 25 and the first pigment may be evenly distributed in the partition wall 210.

The organic material constituting the partition wall 210 may include a commercial polymer, such as BCB, PI, HMDSO, PMM, or PS, a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, and any combinations thereof.

The partition wall-scattering particles 25 may reflect or scatter light incident toward the partition wall 210 from the color conversion layers QD1 and QD2 and the transmissive window TW. The partition wall-scattering particle 25 may have a material and size that enable light in the visible light region to be reflected and/or scattered. In an embodiment, the partition wall-scattering particle 25 may include $TiO_2$, ZnO, a hollow silica particle, or the like, for example. The partition wall-scattering particle 25 may have a size of ½ of a wavelength of incident light to efficiently reflect the light. Accordingly, a diameter of the partition wall-scattering particle 25 may be about 200 nm to about 400 nm.

In some embodiment, the partition wall-scattering particle 25 may include the first partition wall-scattering particles 25a and the second partition wall-scattering particles 25b as shown in FIG. 4. The first partition wall-scattering particles 25a may have a material and size that enable light emitted from the first color conversion layer QD1 to be efficiently reflected and/or scattered. The second partition wall-scattering particles 25b may have a material and size that enable light emitted from the second color conversion layer QD2 to be efficiently reflected and/or scattered.

An amount of the partition wall-scattering particle 25 included in the partition wall 210 may be about 5 wt % to about 20 wt % based on a weight of the partition wall 210. When an amount of the partition wall-scattering particle 25 is about 5 wt % or less, reflection by the partition wall-scattering particle 25 may not occur efficiently. When an amount of the partition wall-scattering particle 25 is about 20 wt % or more, an amount of the organic material included in the partition wall 210 may relatively decrease. The organic material flattens an upper surface 210S of the partition wall 210, which faces the substrate 100, and thus, when an amount of the organic material decreases, the upper surface 210S of the partition wall 210 may be curved rather than being flat. When the upper surface 210S of the partition wall 210 is not flat, a void may be formed when the filler 610 is formed. In the illustrated embodiment, an amount of the partition wall-scattering particle 25 may be about 20 wt % or less, so that the partition wall 210 includes a flat upper surface 210S.

The first pigment included in the partition wall 210 may have a color complementary to the color of light emitted from the organic light-emitting diode OLED. In an embodiment, when the organic light-emitting diode OLED emits blue light, the first pigment may be a yellow pigment, for example. In this case, an amount of the first pigment may be about 0.4 wt % to about 2 wt %. When an amount of the first pigment is greater than about 2 wt %, an absorption amount of light from the color conversion layers QD1 and QD2 toward the partition wall 210 increases, and thus, the reusability of the light may be low, and when an amount of the first pigment is less than about 0.4 wt %, light of an adjacent pixel may not be blocked. Accordingly, an amount of the first pigment may be set by appropriately considering a light reusability and a light-blocking rate.

As the partition wall 210 includes the first pigment, light emitted from the organic light-emitting diode OLED of the first pixel is absorbed by the partition wall 210 and does not affect the second pixel, and thus, the color purity may be improved.

An amount of the first pigment may be determined in consideration of the optical density of the partition wall 210 regardless of the color of the first pigment. In this case, the first pigment may include various colors, such as red, blue, yellow, or black. In other words, the first pigment may include Cr, CrOx, Cr/CrOx, Cr/CrOx/CrNy, a resin (for example, a carbon pigment or an RGB mixed pigment), graphite, or a non-Cr-based material. Alternatively, the first pigment may include a red pigment, a green pigment, and a yellow pigment.

Optical density ("OD") is a value indicating the degree to which a material having a thickness of 1 μm absorbs light, and may satisfy the following equation.

$$OD = \log_{10}(1/T)$$

In this regard, T refers to light transmittance.

In other words, a high OD of a material means that the material absorbs light well, and when an OD of the material is 0, light transmittance is 1, which means that the material is transparent to light.

Generally, an OD of a black matrix located between pixels to prevent color mixing between adjacent pixels may be about 1.0/μm or more, at least 0.3/μm. Because the black matrix should absorb light emitted from an adjacent pixel, a material having a high OD may be generally employed.

However, because the partition wall 210 in the illustrated embodiment includes the partition wall-scattering particles 25, light should be reused by reflection and/or scattering after reaching the partition wall-scattering particles 25 within the partition wall 210. Thus, an OD of the partition wall 210 may be less than an OD of the general black matrix.

Accordingly, in the illustrated embodiment, the OD of the partition wall 210 may be about 0.01/μm to about 0.2/μm. Also, in some embodiments, a minimum width Wth of the partition wall 210 may be about 10 μm or more.

When the OD of the partition wall 210 is 0, that is, when the partition wall 210 includes a transparent material, light emitted from the first color conversion layer QD1 may be incident on the second color conversion layer QD2, resulting in color mixing. Accordingly, the partition wall 210 may have a certain OD. Accordingly, the partition wall 210 may have an OD value of at least 0.01/μm. In this case, the minimum width Wth of the partition wall 210 may be about 10 μm or more.

Even when the minimum width Wth of the partition wall 210 is about 10 μm, the light transmittance rapidly decreases, Thus, the light incident from the second color conversion layer QD2 may not reach the first color conversion layer QD1 and may be absorbed by the partition wall 210. Also, light incident from the organic light-emitting diode OLED of the second pixel P2 may not reach the first color conversion layer QD1 of the first pixel P1 and may be absorbed by the partition wall 210. Accordingly, when the OD of the partition wall 210 is about 0.01/μm or more and the minimum width Wth thereof is about 10 μm or more, color mixing between adjacent pixels may be prevented.

Figure 9:
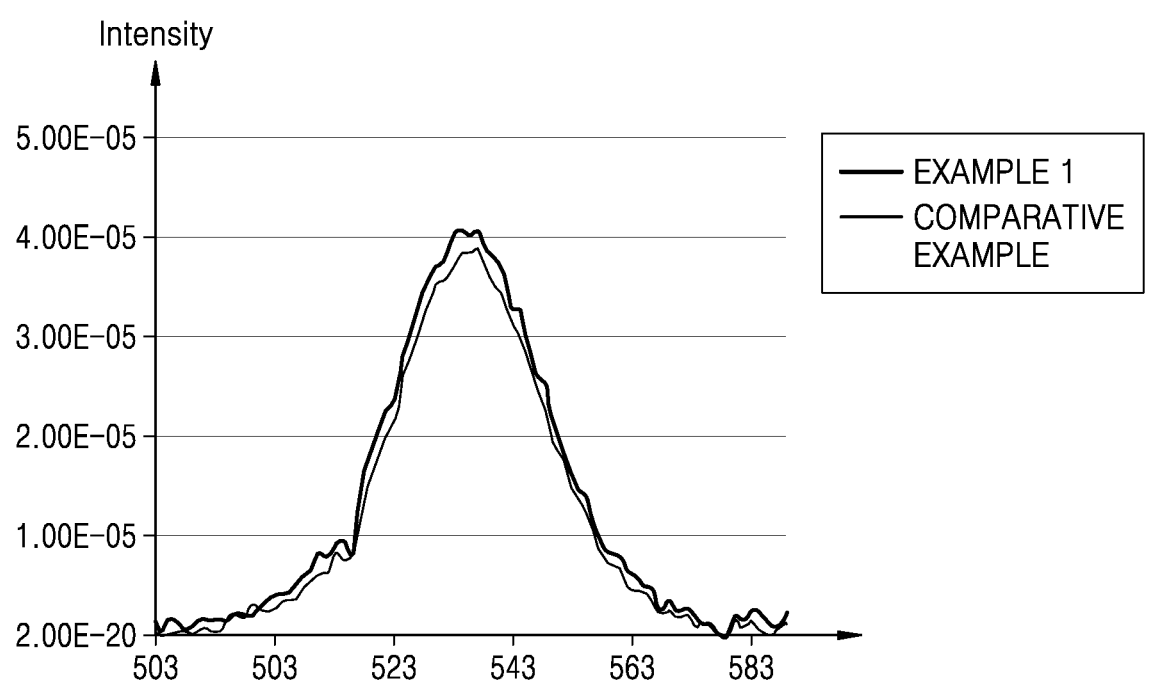
FIGS. 9 and 10 are graphs of an example and a comparative example of the amount of light emitted according to wavelength.
Figure 10:
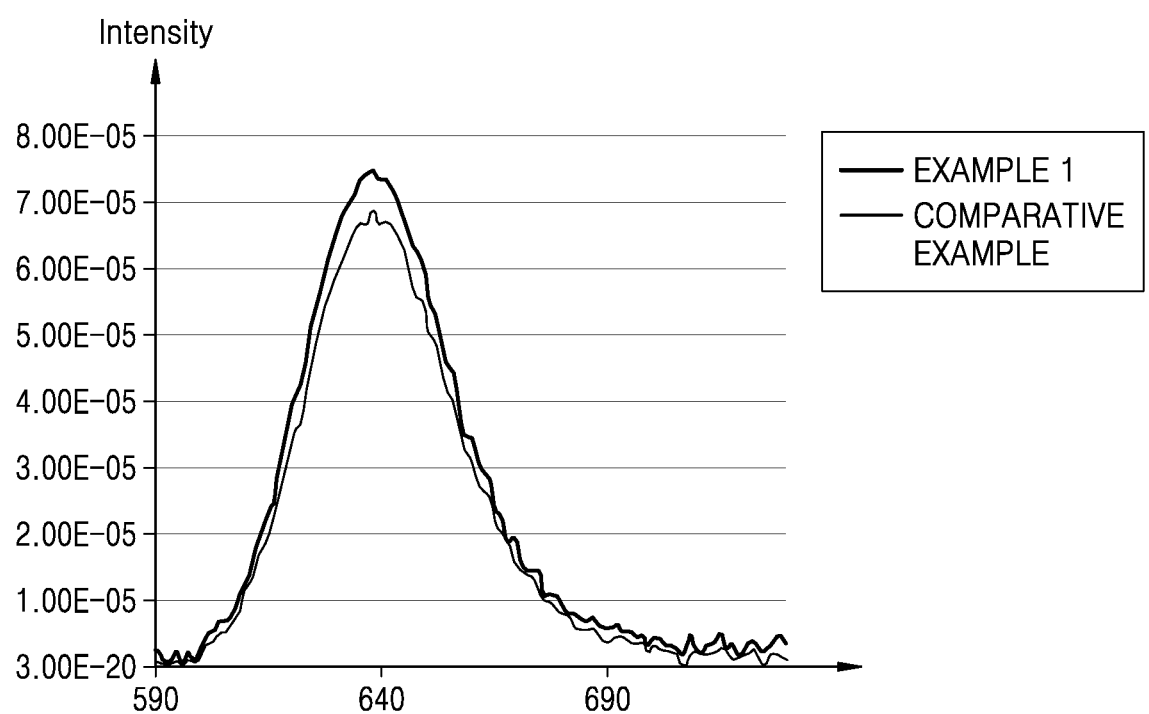

FIGS. 9 and 10 are graphs of an example and a comparative example of the amount of light emitted according to wavelengths. In FIGS. 9 and 10, in the case of Example 1, the OD of a partition wall was about 0.01/μm, and in the case of Comparative Example, the OD of a partition wall was about 1.0/μm. Also, in Example 1 and Comparative Example, the amount of a partition wall-scattering particle was about 6.5 wt %.

FIG. 9 shows the measurement of light intensity with respect to a green pixel, and FIG. 10 shows the measurement of light intensity with respect to a red pixel. Referring to FIGS. 9 and 10, it may be confirmed that the light intensity of Example 1 was greater than the light intensity of Comparative Example with respect to both the green pixel and the red pixel. In detail, in FIGS. 9 and 10, it may be confirmed that the light intensity of Example 1 was improved by about 10% compared to the light intensity of Comparative Example.

Figure 11A:
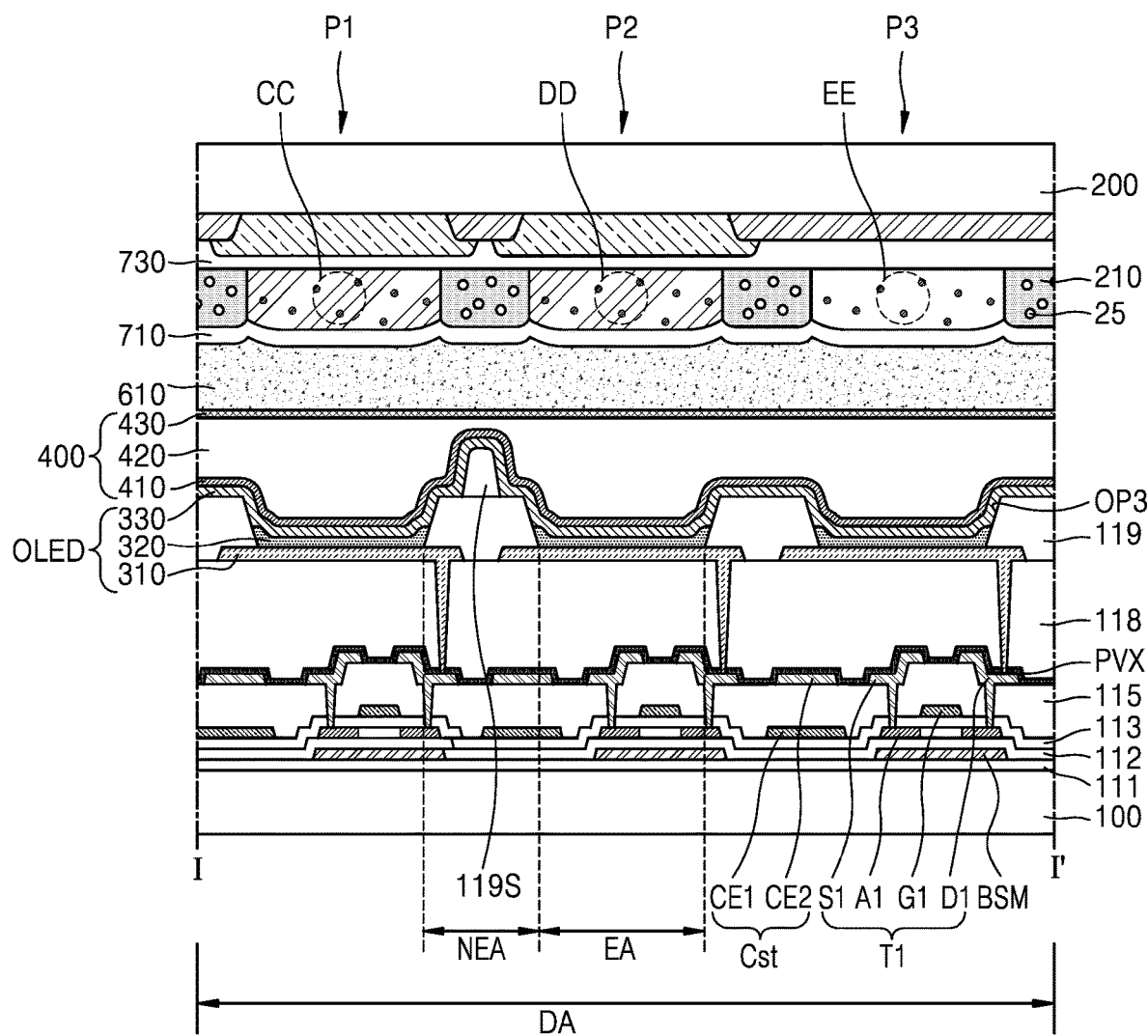
FIG. 11A is a schematic cross-sectional view of an embodiment of a display apparatus according to the disclosure.
Figure 11B:
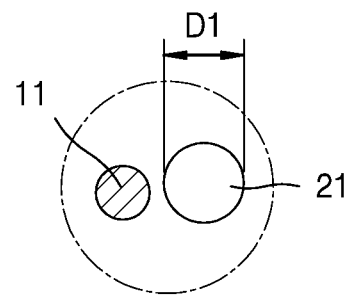
FIGS. 11B to 11D are enlarged views of portions CC, DD and EE, respectively, of FIG. 11A.
Figure 11C:
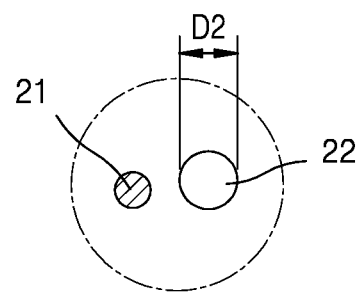
Figure 11D:
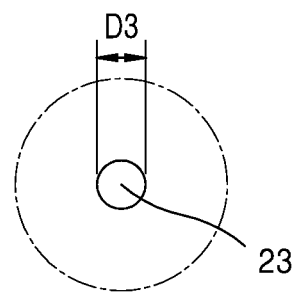

FIG. 11A is a schematic cross-sectional view of another embodiment of a display apparatus according to the disclosure, and FIGS. 11B 11D are enlarged views of portions CC, DD and EE, respectively, of FIG. 11A. The same reference numerals in FIGS. 3A, 8, and 11 denote the same members, and thus, repeated descriptions thereof are omitted.

Referring to FIG. 11A, the first color conversion layer QD1, the second color conversion layer QD2, and the transmissive window TW are disposed under the upper substrate 200, and the partition wall 210 including the partition wall-scattering particles 25 is located between the first color conversion layer QD1, the second color conversion layer QD2, and the transmissive window TW.

The partition wall-scattering particle 25 may include $TiO_2$, ZnO, a hollow silica particle, or the like, and a diameter of the partition wall-scattering particle 25 may be about 200 nm to about 400 nm. An amount of the partition wall-scattering particle 25 included in the partition wall 210 may be about 5 wt % to about 20 wt % based on a weight of the partition wall 210.

The partition wall 210 may include, in addition to the partition wall-scattering particle 25, an organic material and a first pigment, such as Cr, CrOx, Cr/CrOx, Cr/CrOx/CrNy, a resin (for example, a carbon pigment or an RGB mixed pigment), graphite, a non-Cr-based material, as a material for adjusting the optical density. Alternatively, the first pigment may include a red pigment, a green pigment, and a yellow pigment. In some embodiments, the first pigment may be yellow, and an amount of the first pigment included in the partition wall 210 may be about 0.4 wt % to about 2 wt %.

In the illustrated embodiment, the first color conversion layer QD1 may further include a first scattering particle 21, and the second color conversion layer QD2 may further include a second scattering particle 22. Also, the transmissive window TW may include a third scattering particle 23.

The first to third scattering particles 21, 22, and 23 are respectively distributed in the color conversion layers QD1 and QD2 and the transmissive window TW to make color spreadability uniform. A diameter of each of the first to third scattering particles 21, 22, and 23 may be about 200 nm to about 400 nm.

When the first pixel P1 is a red pixel, the second pixel P2 is a green pixel, and the third pixel P3 is a blue pixel, an average diameter D1 of the first scattering particles 21 may be greater than an average diameter D2 of the second scattering particles 22. Also, the average diameter D2 of the second scattering particles 22 may be greater than an average diameter D3 of the third scattering particles 23 (D1>D2>D3).

When a diameter of a scattering particle is provided as a half wavelength of incident light, light scattering may efficiently occur. In view of this, a diameter of each of the first to third scattering particles 21, 22, and 23 may be selected.

In an embodiment, the average diameter D1 of the first scattering particles 21 may be about 330 nm to about 360 nm, and the average diameter D2 of the second scattering particles 22 may be about 250 nm to about 280 nm, for example. Also, the average diameter D3 of the third scattering particles 23 may be about 220 nm to about 240 nm. However, the disclosure is not limited thereto. In another embodiment, average diameters of the first to third scattering particles 21, 22, and 23 may be the same as each other.

Hereinbefore, illustrative embodiments that may be applied to the embodiments of the disclosure have been described. These embodiments may be implemented as separate embodiments, or may be implemented as a combined embodiment.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawings, it will be understood by those of ordinary skill in the art that various changes in form and details may be made therein without departing from the spirit and scope as defined by the following claims.

The invention claimed is:

1. A display apparatus including a first pixel, a second pixel, and a third pixel which emit different colors, the display apparatus comprising: a first color conversion layer disposed on a substrate to correspond to an emission area of the first pixel and comprising first quantum dots; a second color conversion layer corresponding to an emission area of the second pixel and comprising second quantum dots; and a partition wall disposed between the first color conversion layer and the second color conversion layer and comprising partition wall-scattering particles and a first pigment, wherein the partition wall comprises a stack of: a first partition wall layer including the partition wall-scattering particles; and a second partition wall layer including the first pigment.

2. The display apparatus of claim 1, wherein a thickness of the second partition wall layer is less than a thickness of the first partition wall layer.

3. The display apparatus of claim 1, wherein each of the first pixel, the second pixel, and the third pixel comprises a light source which emits blue light, and
the second partition wall layer is disposed closer to the light source than the first partition wall layer is.

4. The display apparatus of claim 3, wherein the first pigment is yellow.

5. The display apparatus of claim 1, wherein a width of the first partition wall layer is less than or equal to a width of the second partition wall layer.

6. The display apparatus of claim 1, wherein an amount of the partition wall-scattering particles included in the partition wall is 5 weight percent (wt %) to 20 weight percent (wt %).

7. The display apparatus of claim 1, wherein the first pixel has a color of a longer wavelength than that of the second pixel, and an average size of the first quantum dots is greater than an average size of the second quantum dots.

8. The display apparatus of claim 1, further comprising a lower scattering particle layer disposed under the first color conversion layer and the second color conversion layer and comprising lower-scattering particles.

9. The display apparatus of claim 1, further comprising an upper scattering particle layer disposed over the first color conversion layer and the second color conversion layer and comprising upper-scattering particles.

10. The display apparatus of claim 1, wherein the partition wall is provided as a single layer, an amount of the partition wall-scattering particles included in the partition wall is 5 weight percent (wt %) to 20 weight percent (wt %), and an amount of the first pigment included in the partition wall is 0.4 weight percent (wt %) to 2 weight percent (wt %).

11. The display apparatus of claim 1, wherein the first color conversion layer comprises first scattering particles, and the second color conversion layer comprises second scattering particles.

12. The display apparatus of claim 11, wherein the first pixel has a color of a longer wavelength than that of the second pixel, and
an average size of the first scattering particles is greater than an average size of the second scattering particles.

13. The display apparatus of claim 1, further comprising a transmissive window arranged to correspond to the third pixel, wherein the transmissive window comprises third scattering particles.

14. The display apparatus of claim 1, further comprising a first color filter arranged to correspond to the first pixel, a second color filter arranged to correspond to the second pixel, and a third color filter arranged to correspond to the third pixel, wherein the first to third color filters have different colors from each other.

15. A display apparatus comprising:
a first pixel, a second pixel, and a third pixel, each comprising an organic light-emitting diode which is disposed on a substrate and emits blue light;
a thin-film encapsulation layer covering the organic light-emitting diode;
an upper substrate disposed on the thin-film encapsulation layer and comprising a first color conversion layer corresponding to the first pixel, a second color conversion layer corresponding to the second pixel, and a transmissive window corresponding to the third pixel; and
a partition wall disposed on a lower surface of the upper substrate to correspond to a non-emission area between the first pixel, the second pixel, and the third pixel,
wherein the partition wall comprises partition wall-scattering particles and a first pigment, and
the partition wall comprises a stack of:
a first partition wall layer comprising the partition wall-scattering particles; and
a second partition wall layer comprising the first pigment.

16. The display apparatus of claim 15, wherein an amount of the partition wall-scattering particles included in the partition wall is 5 weight percent (wt %) to 20 weight percent (wt %).

17. The display apparatus of claim 15, wherein a diameter of the partition wall-scattering particles is about 200 nanometer (nm) to about 450 nanometer (nm).

18. The display apparatus of claim 15, wherein light transmittance of the first partition wall layer is greater than light transmittance of the second partition wall layer.

19. The display apparatus of claim 18, wherein the first pigment is yellow.

20. The display apparatus of claim 15, further comprising a first color filter corresponding to the first pixel, a second color filter corresponding to the second pixel, and a third color filter corresponding to the third pixel, wherein the first to third color filters have different colors from each other.

21. The display apparatus of claim 20, further comprising a light-blocking pattern disposed between the first color filter and the second color filter, wherein the light-blocking pattern has a color identical to that of the third color filter.

22. The display apparatus of claim 15, wherein an optical density of the partition wall is 0.01 per micrometer (/μm) to 0.2 per micrometer (/μm).

* * * * *